(12) United States Patent
Byun et al.

(10) Patent No.: US 12,707,826 B2
(45) Date of Patent: Aug. 11, 2026

(54) DISPLAY DEVICE AND METHOD FOR MANUFACTURING DISPLAY DEVICE

(71) Applicant: Samsung Display Co., LTD., Yongin-si (KR)

(72) Inventors: Jin-Su Byun, Seoul (KR); Jeong Won Kim, Hwaseong-si (KR); Jun Gi Kim, Hwaseong-si (KR); Woong Sik Kim, Seoul (KR); Donghwan Bae, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 951 days.

(21) Appl. No.: 17/835,470

(22) Filed: Jun. 8, 2022

(65) Prior Publication Data

US 2023/0140362 A1 May 4, 2023

(30) Foreign Application Priority Data

Oct. 29, 2021 (KR) ........................ 10-2021-0146701

(51) Int. Cl.

*H10K 59/12* (2023.01)
*H10K 59/122* (2023.01)
*H10K 59/123* (2023.01)
*H10K 59/60* (2023.01)
*H10K 71/00* (2023.01)

(52) U.S. Cl.

CPC ......... *H10K 59/123* (2023.02); *H10K 59/122* (2023.02); *H10K 59/60* (2023.02); *H10K 71/00* (2023.02); *H10K 59/1201* (2023.02)

(58) Field of Classification Search

CPC .................. H10K 59/10–88; H10K 59/80522
See application file for complete search history.

(56) References Cited

U.S. PATENT DOCUMENTS 5,701,055 A * 12/1997 Nagayama ........... H10K 59/122 313/506
2005/0179374 A1* 8/2005 Kwak ............. H10K 59/80522 313/506
2012/0043565 A1* 2/2012 Sagawa .................. H10H 20/84 257/E33.012
2012/0205700 A1* 8/2012 Tanada ................ H10K 50/814 438/46
2014/0183479 A1 7/2014 Park et al.
2014/0183501 A1* 7/2014 Kim .................... H10K 59/122 438/34
2015/0097171 A1* 4/2015 Kim .................... H10K 59/121 438/23

(Continued)

FOREIGN PATENT DOCUMENTS

JP 2000-195677 7/2000
KR 10-2014-0085979 A 7/2014

(Continued)

*Primary Examiner* — Bryan R Junge
(74) *Attorney, Agent, or Firm* — Innovation Counsel LLP

(57) ABSTRACT

A display device according to an embodiment includes a transistor positioned on a substrate; a first electrode electrically connected to the transistor; an emission layer positioned on the first electrode; a second electrode positioned on the emission layer; and a pattern part spaced apart from the first electrode. The pattern part includes a photosensitive pattern layer made of a photosensitive resin.

13 Claims, 27 Drawing Sheets

(56) References Cited

U.S. PATENT DOCUMENTS

2016/0079334 A1 3/2016 Lee et al.
2016/0149156 A1* 5/2016 Kim .................... H10K 59/121 438/46
2017/0031323 A1 2/2017 Kim et al.
2020/0168671 A1* 5/2020 Jang ...................... G06F 3/0443
2020/0258959 A1* 8/2020 Mao ................... H10K 59/8723
2021/0257434 A1* 8/2021 Xie ........................ H10K 71/00
2021/0367184 A1* 11/2021 Song .................... H10K 59/173
2021/0408163 A1* 12/2021 Heo ..................... H10K 59/353
2023/0077957 A1* 3/2023 Okabe ....................... G09F 9/30 257/40

FOREIGN PATENT DOCUMENTS

KR 10-2017-0042415 A 4/2017
KR 10-2017-0128741 11/2017
KR 10-2018-0003965 1/2018
KR 10-2019-0107257 9/2019

* cited by examiner

DA
LA
350
351
370
270
181
191c 191b 191a
191
350
180
175
153
133
132
131
130
151
173
160
142
141
197a 197b 197c
197
270
370
530
800
820
810
111
110
191
370
270
LED
530
710
197
130
151
173
175
TFT

DA
LA
350
351
370
270
181
191
191c 191b 191a
350
180
175
153
133
132
131
130
151
173
160
142
197
197a 197b 197c
270
370
530
800
820 810
141
111
110
130
151
173
175
TFT
530
197
710
191
370
270
LED

DISPLAY DEVICE AND METHOD FOR MANUFACTURING DISPLAY DEVICE

CROSS-REFERENCE TO RELATED APPLICATION

This application claims priority to and benefits of Korean Patent Application No. 10-2021-0146701 under 35 U.S.C. § 119, filed in the Korean Intellectual Property Office (KIPO) on Oct. 29, 2021, the entire contents of which are incorporated herein by reference.

BACKGROUND

1. Technical Field

The disclosure relates to a display device and a manufacturing method thereof.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

An organic light emitting diode (OLED) display includes two electrodes and an organic emission layer interposed therebetween. Electrons injected from one electrode and holes injected from the other electrode are combined in the organic emission layer to generate excitons. The generated excitons are changed to a ground state from an exited state, releasing energy to emit light.

The organic light emitting diode display includes pixels including an organic light emitting diode as a self-emissive element, and transistors for driving the organic light emitting diode and at least one capacitor may be formed in each pixel.

A color change in a low grayscale may occur due to lateral leakage of the organic emission layer.

The above information disclosed in this Background section is only for enhancement of understanding of the background of the described technology, and therefore it may contain information that does not form the prior art that is already known in this country to a person of ordinary skill in the art.

SUMMARY

Embodiments provide a display device capable of improving color change in a low grayscale.

Embodiments also provide a method of manufacturing the display device.

However, embodiments of the disclosure are not limited to those set forth herein. The above and other embodiments will become more apparent to one of ordinary skill in the art to which the disclosure pertains by referencing the detailed description of the disclosure given below.

A display device according to an embodiment includes a transistor positioned on a substrate; a first electrode electrically connected to the transistor; an emission layer positioned on the first electrode; a second electrode positioned on the emission layer; and a pattern part spaced apart from the first electrode, wherein the pattern part includes a photosensitive pattern layer made of a photosensitive resin.

The pattern part may further include an electrode pattern layer. The electrode pattern layer and the first electrode may be made of a same material and positioned on a same layer.

The photosensitive pattern layer may be positioned directly on the electrode pattern layer.

The display device according to an embodiment may further include a bank layer positioned on an edge of the first electrode. The pattern part may further include an inorganic pattern layer. The inorganic pattern layer and the bank layer may be made of a same material and positioned on a same layer.

The photosensitive pattern layer may be positioned directly on the inorganic pattern layer.

The pattern part may be separated from the bank layer.

A side of the photosensitive pattern layer may have a reversed taper shape.

The substrate may include a plurality of pixels. The pattern part may be positioned between the plurality of pixels.

Each of the plurality of pixels may be a polygon including a side extending in a first direction and a side extending in a second direction perpendicular to the first direction in a plan view. The pattern part may be formed of a bar shape extending in the first direction or the second direction in a plan view.

At least one pattern part may be positioned between adjacent ones of the plurality of pixels.

The emission layer may include a plurality of light emission parts and a charge generation layer positioned between the plurality of light emission parts.

The emission layer and the second electrode may be positioned entirely on the substrate. A portion of the emission layer and the second electrode positioned over the first electrode may be separated from a portion of the emission layer and the second electrode positioned over the pattern part.

The display device may have a display area, an opening area positioned within the display area, and a peripheral area positioned between the opening area and the display area. The display device may further include a dam positioned in the peripheral area; and an auxiliary pattern part positioned around the dam and spaced apart from the dam. The auxiliary pattern part may include a photosensitive auxiliary pattern layer made of a photosensitive resin.

The photosensitive auxiliary pattern layer and the photosensitive pattern layer may be made of a same material and positioned on a same layer.

A manufacturing method of a display device according to an embodiment includes forming a transistor on a substrate; forming a conductive layer on the transistor; forming a photoresist pattern including a first portion having a first thickness and a second portion having a second thickness thicker than the first thickness on the conductive layer; patterning the conductive layer by using the photoresist pattern as a mask to form a first electrode electrically connected to the transistor and an electrode pattern layer spaced apart from the first electrode; ashing the photoresist pattern to remove the first portion positioned on the first electrode and to form a photosensitive pattern layer positioned on the electrode pattern layer; forming an emission layer on the first electrode; and forming a second electrode on the emission layer.

A side of the photosensitive pattern layer may have a reversed taper shape.

The emission layer may include a plurality of light emission parts, and a charge generation layer positioned between the plurality of light emission parts. The emission layer and the second electrode may be positioned entirely on the substrate. A portion of the emission layer and the second electrode positioned over the first electrode may be separated from a portion of the emission layer and the second electrode positioned over the photosensitive pattern layer.

A manufacturing method of a display device according to an embodiment includes forming a transistor on a substrate; forming a first electrode electrically connected to the transistor; forming an inorganic insulating layer on the first electrode; forming a photoresist pattern including a first portion having a first thickness and a second portion having a second thickness thicker than the first thickness on the inorganic insulating layer; patterning the inorganic insulating layer by using the photoresist pattern as a mask to form a bank layer positioned on an edge of the first electrode and an inorganic pattern layer spaced apart from the bank layer; ashing the photoresist pattern to remove the first portion positioned on the bank layer and to form a photosensitive pattern layer positioned on the inorganic pattern layer; forming an emission layer on the first electrode; and forming a second electrode on the emission layer.

A side of the photosensitive pattern layer may have a reversed taper shape.

The emission layer may include a plurality of light emission parts, and a charge generation layer positioned between the plurality of light emission parts. The emission layer and the second electrode may be positioned entirely on the substrate. A portion of the emission layer and the second electrode positioned over the first electrode may be separated from a portion of the emission layer and the second electrode positioned over the photosensitive pattern layer.

According to embodiments, the emission layer may be separated in at least a partial area, and a lateral leakage path may be reduced. Thus, a color change may be reduced (or prevented) in a low grayscale.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
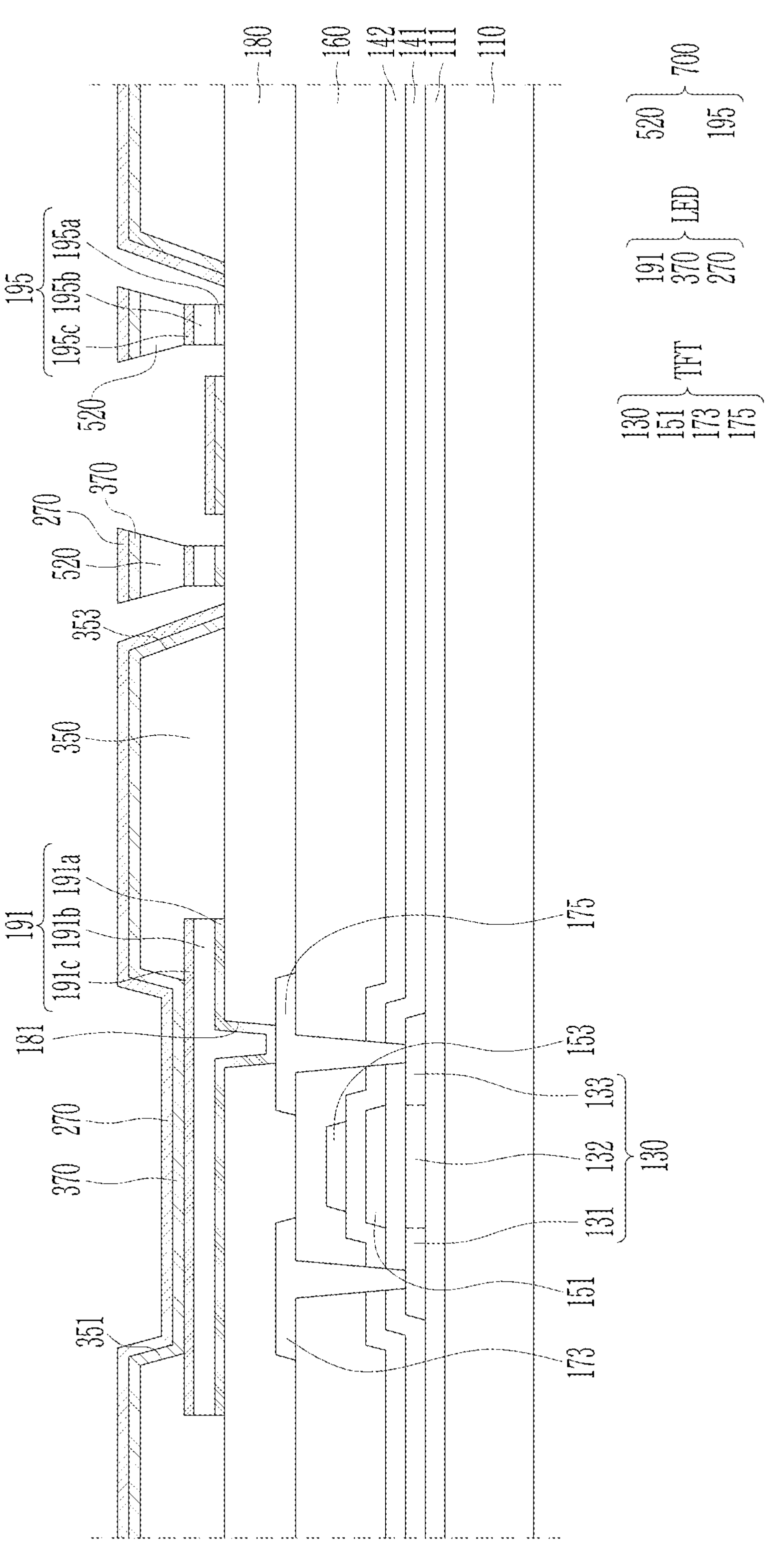
FIG. 1 is a schematic cross-sectional view of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the disclosure. Therefore, unless otherwise specified, the features, components, modules, layers, films, panels, regions, and/or aspects, etc. (hereinafter individually or collectively referred to as "elements"), of various embodiments may be otherwise combined, separated, interchanged, and/or rearranged without departing from the inventive concept.

When an embodiment may be implemented differently, a specific process order may be performed differently from the described order. For example, two consecutively described processes may be performed substantially at the same time or performed in an order opposite to the described order. Also, like reference numerals denote like elements and similar elements throughout the specification.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" may encompass both an orientation of above and below. Furthermore, the apparatus may be otherwise oriented (e.g., rotated 90 degrees or at other orientations), and, as such, the spatially relative descriptors used herein interpreted accordingly.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, in the specification, the word "on" or "above" means positioned on or below the object portion, and does not necessarily mean positioned on the upper side of the object portion based on a gravitational direction.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Further, in the specification, the phrase "in a plan view" means when an object portion is viewed from above, and the phrase "in a cross-sectional view" means when a cross-section taken by vertically cutting an object portion is viewed from the side.

A display device according to an embodiment is described with reference to FIGS. 1 to 3.

FIG. 1 is a schematic cross-sectional view of a display device according to an embodiment. FIG. 2 is a schematic plan view showing some layer of a display device according to an embodiment. FIG. 3 is a schematic view showing layers included in some layers of FIG. 1. FIG. 2 shows a first electrode and a pattern part of the display device according to the embodiment, and FIG. 3 shows the layers included in an emission layer of the display device according to the embodiment.

Referring to FIG. 1, the display device according to the embodiment may include a substrate 110, a semiconductor 130, a gate electrode 151, a source electrode 173, and a drain electrode 175. The semiconductor 130, the gate electrode 151, the source electrode 173, and the drain electrode 175 may be disposed on the substrate 110.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may include a flexible material capable of bending or folding and may have a single-layered or multi-layered structure.

A buffer layer 111 may be positioned on the substrate 110. The buffer layer 111 may have a single-layered or multi-layered structure. The buffer layer 111 may include an inorganic insulating material or an organic insulating material including at least one of a silicon nitride ($SiN_x$), a silicon oxide ($SiO_x$), and a silicon oxynitride ($SiO_xN_y$). In other embodiments, the buffer layer 111 may be omitted. A barrier layer may be further positioned between the substrate 110 and the buffer layer 111. The barrier layer may have a single-layered or multi-layered structure. The barrier layer may include an inorganic insulating material such as a silicon nitride ($SiN_x$), a silicon oxide ($SiO_x$), and a silicon oxynitride ($SiO_xN_y$).

A semiconductor 130 may be positioned on the buffer layer 111. The semiconductor 130 may include a first area 131, a channel 132, and a second area 133. The first area 131 and the second area 133 may be positioned on sides (e.g., both sides) of the channel 132 of the semiconductor 130, respectively. The semiconductor 130 may include at least one semiconductor material of amorphous silicon, polysilicon, and an oxide semiconductor.

A first gate insulating layer 141 may be positioned on the semiconductor 130. The first gate insulating layer 141 may have a single-layered or multi-layered structure. The first gate insulating layer 141 may include an inorganic insulating material such as a silicon nitride ($SiN_x$), a silicon oxide ($SiO_x$), and a silicon oxynitride ($SiO_xN_y$).

A gate electrode 151 may be positioned on the first gate insulating layer 141. The gate electrode 151 may overlap the channel 132 of the semiconductor 130 in a plan view. The gate electrode 151 may have a single-layered or multi-layered structure. The gate electrode 151 may include a metal material such as molybdenum (Mo), aluminum (Al), copper (Cu), and/or titanium (Ti). The gate electrode 151 may include an alloy of the above-described metal material. After forming the gate electrode 151, a doping process or plasma treatment may be performed on the gate electrode 151. A part of the semiconductor 130 that is covered by the gate electrode 151 may not be doped or plasma-treated, and the part of the semiconductor 130 that is not covered by the gate electrode 151 may be doped or plasma-treated to have electrical conductivity (e.g., the same characteristics as conductor).

A second gate insulating layer 142 may be positioned on the gate electrode 151. The second gate insulating layer 142 may have a single-layered or multi-layered structure. The second gate insulating layer 142 may include an inorganic insulating material such as a silicon nitride ($SiN_x$), a silicon oxide ($SiO_x$), and a silicon oxynitride ($SiO_xN_y$).

A first storage electrode 153 may be positioned on the second gate insulating layer 142. The first storage electrode 153 may have a single-layered or multi-layered structure. The first storage electrode 153 may include a metal material such as molybdenum (Mo), aluminum (Al), copper (Cu), and/or titanium (Ti). The first storage electrode 153 may include an alloy of the above-described metal material. The first storage electrode 153 may overlap the gate electrode 151 in a plan view to form a storage capacitor.

An interlayer insulating layer 160 may be positioned on the first storage electrode 153. The interlayer insulating layer 160 may have a single-layered or multi-layered structure. The interlayer insulating layer 160 may include an inorganic insulating material or an organic insulating material.

A source electrode 173 and a drain electrode 175 may be positioned on the interlayer insulating layer 160. The source electrode 173 and the drain electrode 175 may have a single-layered or multi-layered structure. The source electrode 173 and the drain electrode 175 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu). For example, the source electrode 173 and the drain electrode 175 may include an alloy of the above-described materials. For example, the source electrode 173 and the drain electrode 175 may include a lower layer, an intermediate layer, and an upper layer. The intermediate layer of the source electrode 173 and the drain electrode 175 may be made of aluminum (Al), and the lower layer and the upper layer of the source electrode 173 and the drain electrode 175 may be made of titanium (Ti).

The interlayer insulating layer 160 may include an opening overlapping the source electrode 173 and the first area 131 of the semiconductor 130 in a plan view. The source electrode 173 may be electrically connected to the first area 131 of the semiconductor 130 through the opening. The interlayer insulating layer 160 may include an opening overlapping the drain electrode 175 and the second area 133 of the semiconductor 130 in a plan view. The drain electrode 175 may be electrically connected to the second area 133 of the semiconductor 130 through the opening.

The semiconductor 130, the gate electrode 151, the source electrode 173, and the drain electrode 175 may constitute (or form) a transistor TFT. According to an embodiment, the transistor TFT may include only the source area and the drain area of the semiconductor 130 instead of the source electrode 173 and drain electrode 175.

A passivation layer 180 may be positioned on the source electrode 173 and the drain electrode 175. The passivation layer 180 may include an organic insulating material such as a generally-used polymer, a polymer derivative having a phenol-based group, an acryl-based polymer, an imide-based polymer, a polyimide, an acryl-based polymer, and a siloxane-based polymer. The generally-used polymer of the passivation layer 180 may include polymethyl methacrylate (PMMA), polystyrene (PS), or a combination thereof.

A first electrode 191 may be positioned on the passivation layer 180. The first electrode 191 may also be referred to as an anode, and may be composed of a single layer including a transparent conductive oxide film or a metal material, or a multi-layer including the above-describe materials. The transparent conductive oxide film of the first electrode 191 may include at least one of indium tin oxide (ITO), poly-ITO, indium zinc oxide (IZO), indium gallium zinc oxide (IGZO), and indium tin zinc oxide (ITZO). The metal material of the first electrode 191 may include at least one of silver (Ag), molybdenum (Mo), copper (Cu), gold (Au), and aluminum (Al). For example, the first electrode 191 may include a lower layer 191*a*, an intermediate layer 191*b*, and an upper layer 191*c*. The lower layer 191*a* of the first electrode 191 may be positioned (e.g., directly positioned) on the passivation layer 180. The intermediate layer 191*b* may be positioned on the lower layer 191*a*. The upper layer 191*c* may be positioned on the intermediate layer 191*b*. The intermediate layer 191*b* of the first electrode 191 may be made of a different material from that of the lower layer 191*a* and/or the upper layer 191*c*. For example, the intermediate layer 191*b* may be made of silver (Ag), and the lower layer 191*a* and the upper layer 191*c* may be made of ITO.

The passivation layer 180 may include an opening 181 overlapping the drain electrode 175 and the first electrode 191 in a plan view. The first electrode 191 may be electrically connected to the drain electrode 175 through the opening 181. For example, the drain electrode 175 may be in contact with a bottom surface of the lower layer 191*a* of the first electrode 191. Accordingly, the first electrode 191 may receive an output current, which is transferred from the drain electrode 175 to the emission layer 370.

A pattern part 700 may be positioned on the passivation layer 180. The pattern part 700 may be spaced apart from the first electrode 191. The pattern part 700 may include an electrode pattern layer 195 and a photosensitive pattern layer 520.

The electrode pattern layer 195 and the first electrode 191 may be made of (or include) a same material and may be positioned on a same layer. The electrode pattern layer 195 may be composed of a single layer including a transparent conductive oxide film or a metal material, or a multi-layer including the above-described materials. For example, the electrode pattern layer 195 may include a lower layer 195*a*, an intermediate layer 195*b*, and an upper layer 195*c*. The lower layer 195*a* of the electrode pattern layer 195 may be positioned (e.g., directly positioned) on the passivation layer 180. The intermediate layer 195*b* may be positioned on the lower layer 195*a*. The upper layer 195*c* may be positioned on the intermediate layer 195*b*. The lower layer 195*a* of the electrode pattern layer 195 and the lower layer 191*a* of the first electrode 191 may be made of a same material and positioned on a same layer. The intermediate layer 195*b* of the electrode pattern layer 195 and the intermediate layer 191*b* of the first electrode 191 may be made of a same material and may be positioned on a same layer. The upper layer 195*c* of the electrode pattern layer 195 and the upper layer 191*c* of the first electrode 191 may be made of a same material and positioned on a same layer. The intermediate layer 195*b* of the electrode pattern layer 195 may be made of a different material from that of the lower layer 195*a* and/or the upper layer 195*c*. For example, the intermediate layer 195*b* may be made of silver (Ag), and the lower layer 195*a* and the upper layer 195*c* may be made of ITO.

The photosensitive pattern layer 520 may be made of a photosensitive resin, and may be positioned on the electrode pattern layer 195. The photosensitive resin of the photosensitive pattern layer 520 may be a resin composed of a polymer that is changed into a dissolved or insoluble state by a photochemical reaction. The photosensitive pattern layer 520 and a photoresist used in the process of patterning the first electrode 191 may be made of a same material. The photosensitive pattern layer 520 may be positioned (e.g., directly positioned) on the electrode pattern layer 195. The photosensitive pattern layer 520 may be in contact with an upper surface of the upper layer 195*c* of the electrode pattern layer 195. A side surface of the photosensitive pattern layer 520 may have a reversed taper shape in a cross-sectional view. For example, a width of an upper surface of the photosensitive pattern layer 520 may be wider than a width of a bottom surface (e.g., lower surface) thereof. The width of the photosensitive pattern layer 520 may be gradually narrowed from a top surface (e.g., upper surface) to a bottom surface (e.g., lower surface) thereof.

Figure 2:
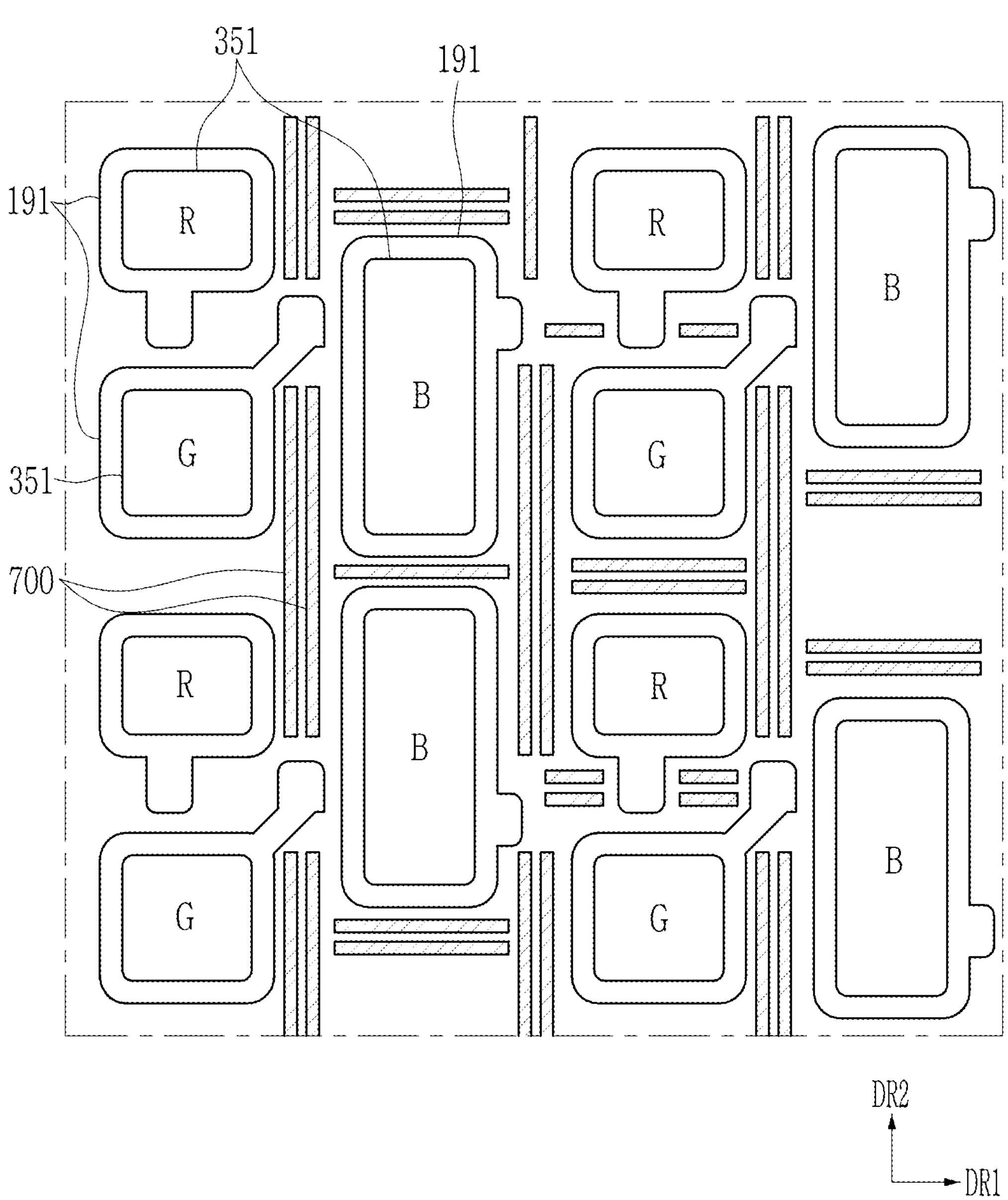
FIG. 2 is a schematic plan view showing some layer of a display device according to an embodiment.

Referring to FIG. 2, the substrate 110 may include pixels R, G, and B. The pattern part 700 may be positioned between the pixels R, G, and B in a plan view.

Pixels R, G, and B may include a first pixel R, a second pixel G, and a third pixel B. The first pixel R may display red. The second pixel G may display green. The third pixel B may display blue. However, this is only an example, and the pixels may further include pixels displaying other colors in addition to red, green, and blue. For example, pixels may further include a white pixel. As another example, pixels may include a pixel displaying cyan, a pixel displaying magenta, and a pixel displaying yellow.

Each of pixels R, G, and B may be formed of a polygon including a side extending in a first direction DR1 and a side extending in a second direction DR2 intersecting (e.g., perpendicular to) the first direction DR1. The first direction DR1 may be a row direction of the display device, and the second direction DR2 may be a column direction of the display device. For example, each of pixels R, G, and B may be formed as a rectangle. A plane shape of the first electrode 191 of each of pixels R, G, and B may be a rectangle.

Pixels R, G, and B may be adjacent to each other in a first direction DR1 and a second direction DR2. For example, the first pixel R and the second pixel G may be alternately arranged in the second direction DR2. The first pixel R and the second pixel G may be adjacent to each other in the second direction DR2. Multiple third pixels B may be disposed in the second direction DR2. The third pixel B may be adjacent to the first pixel R and the second pixel G in the first direction DR1.

The pattern part 700 may have a bar shape extending in the first direction DR1 or the second direction DR2. The pattern part 700 extending in the first direction DR1 may be positioned between the pixels R, G, and B adjacent to each other in the second direction DR2. For example, the pattern part 700 extending in the first direction DR1 may be positioned between the first pixel R and the second pixel G or between the third pixels B. The pattern part 700 extending in the second direction DR2 may be positioned between the pixels R, G, and B adjacent to each other in the first direction DR1. For example, the pattern part 700 extending in the second direction DR2 may be positioned between the first pixel R and the third pixel B or between the second pixel G and the third pixel B. However, this is only an example, and the shape and the extension direction of the pattern part 700 may be variously changed.

The pattern part 700 may be separated from the first electrodes 191 of pixels R, G, and B. For example, the pattern part 700 may be spaced apart from the first electrodes 191 of pixels R, G, and B at an interval. At least one pattern part 700 may be positioned between the adjacent pixels R, G, and B. For example, as illustrated, one, two, or four pattern parts 700 may be positioned between the adjacent pixels R, G, and B. For example, pattern parts 700 may be spaced apart from each other. However, this is only an example, and the number of pattern parts 700 positioned between the adjacent pixels R, G, and B may be variously changed. The number of pattern parts 700 may be selected according to the separation distance between the pixels R, G, and B.

A bank layer 350 may be positioned on the first electrode 191 and the passivation layer 180. The bank layer 350 may also be referred to as a pixel defining layer (PDL), and include a pixel opening 351 overlapping the first electrode 191 in a plan view. The pixel opening 351 may overlap a central portion of the first electrode 191 and may not overlap an edge of the first electrode 191 in a plan view. For example, the bank layer 350 may be positioned on the edge of the first electrode 191. A size of the pixel opening 351 may be smaller than a size of the first electrode 191. The bank layer 350 may be an organic insulator including at least one material selected from the group consisting of polyimide, polyamide, acryl resin, benzocyclobutene, and phenol resin. According to the embodiment, the partition wall 380 may be formed of a black PDL (Pixel Defining Layer) having a black color.

The bank layer 350 may further include an opening 353 overlapping the pattern part 700 in a plan view. The opening 353 of the bank layer 350 may overlap the pattern part 700 and a peripheral area thereof in a plan view. Therefore, the bank layer 350 may not be positioned on the pattern part 700. The pattern part 700 may be spaced apart from the bank layer 350.

An emission layer 370 may be positioned on the first electrode 191. Referring to FIG. 3, the emission layer 370 (e.g., refer to FIG. 1) may include light emission parts 1370 and 2370, and a charge generation layer 375 positioned between the light emission parts 1370 and 2370.

The light emission parts 1370 and 2370 may include a first light emission part 1370 and a second light emission part 2370. Each of the first light emission part 1370 and the second light emission part 2370 may include multiple layers. The first light emission part 1370 may include a hole injection layer 1370*a*, a hole transport layer 1370*b*, an organic emission layer 1370*c*, an electron transport layer 1370*d*, and an electron injection layer 1370*e*. The second light emission part 2370 may include a hole injection layer 2370*a*, a hole transport layer 2370*b*, an organic emission layer 2370*c*, an electron transport layer 2370*d*, and an electron injection layer 2370*e*. Each of the organic emission layers 1370*c* and 2370*c* may include a low molecular weight or high molecular weight organic material that emits light such as red, green, and blue. At least part of the hole injection layers 1370*a* and 2370*a*, the hole transport layers 1370*b* and 2370*b*, the electron transport layers 1370*d* and 2370*d*, and the electron injection layers 1370*e* and 2370*e* may be omitted. The hole injection layer 1370*a* of the first light emission part 1370 may be in contact with the first electrode 191. The electron injection layer 2370*e* of the second light emission part 2370 may be in contact with the second electrode 270.

The charge generation layer 375 may be positioned between the first light emission part 1370 and the second light emission part 2370. The charge generation layer 375 may be a layer that generates electrons to serve as a cathode for one light emission part among two light emission parts 1370 and 2370 adjacent to each other, and generates holes to serve as an anode for another light emission part. For example, the charge generation layer 375 may function as a cathode for the first light emission part 1370 and function as an anode for the second light emission part 2370.

The charge generation layer 375 may include an n-type charge generation layer 375*a* and a p-type charge generation layer 375*b*. The n-type charge generation layer 375*a* and the p-type charge generation layer 375*b* may be joined to each other to form an NP junction. Electrons and holes may be simultaneously generated between the n-type charge generation layer 375*a* and the p-type charge generation layer 375*b* by the NP junction. The generated electrons may be transferred to one of two light emission parts 1370 and 2370 adjacent to each other through the n-type charge generation layer 375*a*. The generated holes may be transmitted to the another of two light emission parts 1370 and 2370 adjacent to each other through the p-type charge generation layer 375*b*.

It has been described above that the emission layer 370 includes two light emission parts 1370 and 2370, but is not limited thereto. The emission layer 370 may include three or more light emission parts. For example, the emission layer 370 may include three light emission parts and two charge generation layers positioned between the light emission parts.

The emission layer 370 may be positioned not only over the first electrode 191, but also in another areas on the substrate 110 as a whole. The organic emission layers 1370*c* and 2370*c* of the emission layer 370 may be patterned and positioned only within the pixel opening 351. Except for the organic emission layer 1370*c* and 2370*c*, the remaining layers (e.g., hole injection layer 1370*a*/2370*a*, hole transport layer 1370*b*/2370*b*, electron transport layer 1370*d*/2370*d*, and electron injection layer 1370*e*/2370*e*) may be positioned entirely on the substrate 110. The hole injection layer 1370*a*/2370*a*, the hole transport layer 1370*b*/2370*b*, the electron transport layer 1370*d*/2370*d*, the electron injection layer 1370*e*/2370*e*, and the charge generation layer 375 may be positioned entirely on the substrate 110.

A second electrode 270 may be positioned on the emission layer 370. The second electrode 270 may be entirely positioned on the substrate 110. The second electrode 270 may also be referred to as a cathode, and may be formed of a transparent conductive film including at least one of indium tin oxide (ITO), indium zinc oxide (IZO), indium gallium zinc oxide (IGZO), and indium tin zinc oxide (ITZO). The second electrode 270 may have a translucent characteristic, and may constitute a microcavity together with the first electrode 191. The first electrode 191, the emission layer 370, and the second electrode 270 may constitute a light emitting diode (LED).

The emission layer 370 and the second electrode 270 may be positioned entirely on the substrate 110. At least some areas of the emission layer 370 and the second electrode 270 may be separated from remaining areas thereof. A portion of the emission layer 370 positioned on the first electrode 191 may be separated from a portion of the emission layer 370 positioned on the pattern part 700. In the display device according to an embodiment, the portion of the emission layer 370 positioned on the first electrode 191 may be separated from the portion of the emission layer 370 positioned on the pattern part 700. Thus, although leakage occurs in the charge generation layer 375, a transmission path of the leakage may be blocked, and a color change (e.g., optical characteristics of color change) in a low grayscale may be improved. The portion of the second electrode 270 positioned on the first electrode 191 may be separated from the portion of the second electrode 270 positioned on the pattern part 700. The emission layer 370 and the second electrode 270 may be separated from the edge of the pattern part 700. The portions of the emission layer 370 and the second electrode 270 positioned on the pattern part 700 may be separated from the portions of the emission layer 370 and the second electrode 270 positioned outside the pattern part 700. Some of the layers constituting the emission layer 370 may not be separated, but may be connected as a whole. For example, the first light emission part 1370 and the charge generation layer 375 may have a separated form on the edge of the pattern part 700, and the second light emission part 2370 may have a connected form on the edge of the pattern part 700. Likewise, the second electrode 270 may be connected as a whole. For example, the second electrode 270 may have a connected shape on the edge of the pattern part 700.

Although not shown, an encapsulation layer may be further positioned on the second electrode 270. The encapsulation layer may protect the light emitting diode (LED)

from moisture or oxygen that may be inflowed from the outside, and may include at least one inorganic layer and at least one organic layer. For example, the encapsulation layer may have a shape in which a first inorganic encapsulation layer, an organic encapsulation layer, and a second inorganic encapsulation layer are stacked. However, this is only an example, and the number of inorganic and organic layers constituting the encapsulation layer may be variously changed.

Although the structure in which one transistor is electrically connected to the light emitting diode (LED) has been described above, each light emitting diode (LED) LED may be electrically connected to transistors. Hereinafter, an example of the pixel of a display device according to an embodiment is provided with reference to FIG. 4.

Figure 4:
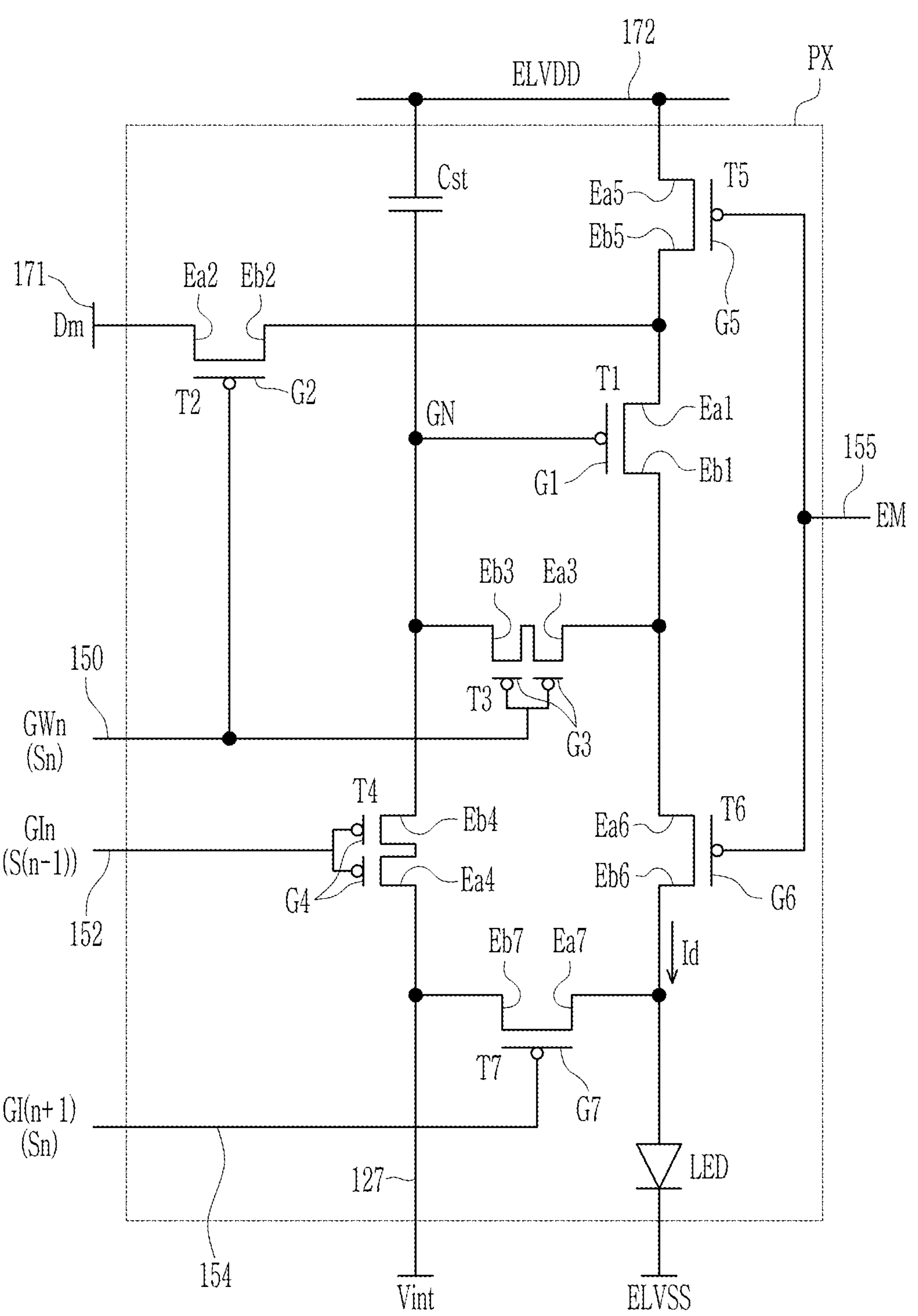
FIG. 4 is a schematic diagram of an equivalent circuit of a pixel of a display device according to an embodiment.

FIG. 4 is a schematic diagram of an equivalent circuit of a pixel of a display device according to an embodiment.

Referring to FIG. 4, the display device according to an embodiment may include pixels PX capable of displaying an image and signal lines 127, 150, 152, 154, 171, and 172. One pixel PX may include transistors T1, T2, T3, T4, T5, T6, and T7 electrically connected to the signal lines 127, 150, 152, 154, 171, and 172, a capacitor Cst, and at least one light emitting diode LED. In the embodiment, an example in which one pixel PX includes each light emitting diode LED is mainly described.

The signal lines 127, 150, 152, 154, 155, 171, and 172 may include an initialization voltage line 127, scan lines 150, 152, and 154, a light emission control line 155, a data line 171, and a driving voltage line 172.

The initialization voltage line 127 may transmit an initialization voltage Vint. Scan lines 150, 152, and 154 may transmit scan signals GWn, GIn, and GI(n+1), respectively. The scan signals GWn, GIn, and GI(n+1) may transmit a gate-on voltage and a gate-off voltage that may turn on/off the transistors T2, T3, T4, and T7 included in the pixel PX.

The scan lines 150, 152, and 154 electrically connected to one pixel PX may include a first scan line 150, a second scan line 152, and a third scan line 154. The first scan line 150 may transmit a scan signal GWn. The second scan line 152 may transmit a scan signal GIn having a gate-on voltage at different timing from that of the first scan line 150. The third scan line 154 may transmit a scan signal GI(n+1). In the embodiment, an example in which the second scan line 152 transmits the gate-on voltage at a timing earlier than the first scan line 150 is mainly described. For example, in case that the scan signal GWn is an n-th scan signal Sn among scan signals applied during a frame (n is a natural number of 1 or more), the scan signal Gin may be a previous scan signal such as an (n−1)-th scan signal S(n−1), and the scan signal GI(n+1) may be an n-th scan signal Sn. However, the embodiment is not limited thereto, and the scan signal GI(n+1) may be a different scan signal from the n-th scan signal Sn.

The light emission control line 155 may transmit a control signal, and may transmit an emission control signal controlling the emission of the light emitting diode LED included in the pixel PX. The control signal transmitted by the light emission control line 155 he may transmit the gate-on voltage and the gate-off voltage, and may have a different waveform from that of the scan signal transmitted by the scan lines 150, 152, and 154.

The data line 171 may transmit a data signal Dm, and the driving voltage line 172 may transmit a driving voltage ELVDD. The data signal Dm may have different voltage levels according to the image signal input to the display device. The driving voltage ELVDD may have a substantially constant level.

Although not shown, the display device may further include a driver transmitting a signal to the signal lines 127, 150, 152, 154, 171, and 172.

The transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 150 may transmit the scan signal GWn to the second transistor T2 and the third transistor T3. The second scan line 152 may transmit the scan signal GIn to the fourth transistor T4. The third scan line 154 may transmit the scan signal GI(n+1) to the seventh transistor T7. The light emission control line 155 may transmit a light emission control signal EM to the fifth transistor T5 and the sixth transistor T6.

A gate electrode G1 of the first transistor T1 may be electrically connected to a terminal of the capacitor Cst through a driving gate node GN. A first electrode Ea1 of the first transistor T1 may be electrically connected to the driving voltage line 172 via the fifth transistor T5. A second electrode Eb1 of the first transistor T1 may be electrically connected to an anode of the light emitting diode LED via the sixth transistor T6. The first transistor T1 may receive the data signal Dm transmitted from the data line 171 according to a switching operation of the second transistor T2 and supply a driving current Id to the light emitting diode LED.

A gate electrode G2 of the second transistor T2 may be electrically connected to the first scan line 150. A first electrode Ea2 of the second transistor T2 may be electrically connected to the data line 171. A second electrode Eb2 of the second transistor T2 may be electrically connected to the first electrode Ea1 of the first transistor T1 and electrically connected to the driving voltage line 172 via the fifth transistor T5. The second transistor T2 may be turned on according to the scan signal GWn transmitted through the first scan line 151 and transmit the data signal Dm transmitted from the data line 171 to the first electrode Ea1 of the first transistor T1.

A gate electrode G3 of the third transistor T3 may be electrically connected to the first scan line 150. A first electrode Ea3 of the third transistor T3 may be electrically connected to the second electrode Eb1 of the first transistor T1 and electrically connected to the anode of the light emitting diode LED through the sixth transistor T6. A second electrode Eb3 of the third transistor T3 may be electrically connected to a second electrode Eb4 of the fourth transistor T4, a terminal of the capacitor Cst, and the gate electrode G1 of the first transistor T1. The third transistor T3 may be turned on according to the scan signal GWn received through the first scan line 150, and the gate electrode G1 and the second electrode Eb1 of the first transistor T1 may be electrically connected to each other to diode-connect the first transistor T1.

A gate electrode G4 of the fourth transistor T4 may be electrically connected to the second scan line 152. A first electrode Ea4 of the fourth transistor T4 may be electrically connected to a terminal of the initialization voltage Vint. The second electrode Eb4 of the fourth transistor T4 may be electrically connected to a terminal of capacitor Cst and the gate electrode G1 of the first transistor T1 through the second electrode Eb3 of the third transistor T3. The fourth transistor T4 may be turned on according to the scan signal GIn received through the second scan line 152, and the initialization voltage Vint may be transmitted to the gate electrode G1 of the first transistor T1, thereby performing an initialization operation of initializing the voltage of the gate electrode G1 of the first transistor T1.

A gate electrode G5 of the fifth transistor T5 may be electrically connected to the light emission control line 155. A first electrode Ea5 of the fifth transistor T5 may be electrically connected to the driving voltage line 172. A second electrode Eb5 of the fifth transistor T5 may be electrically connected to the first electrode Ea1 of the first transistor T1 and the second electrode Eb2 of the second transistor T2.

A gate electrode G6 of the sixth transistor T6 may be electrically connected to the light emission control line 155. A first electrode Ea6 of the sixth transistor T6 may be electrically connected to the second electrode Eb1 of the first transistor T1 and the first electrode Ea3 of the third transistor T3. A second electrode Eb6 of the sixth transistor T6 may be electrically connected to the anode of the light emitting diode (LED) LED. The fifth transistor T5 and the sixth transistor T6 may be simultaneously turned on depending on the light emission control signal EM transmitted through the light emission control line 155, thereby transmitting the driving voltage ELVDD to the light emitting diode LED through the diode-connected first transistor T1.

A gate electrode G7 of the seventh transistor T7 may be electrically connected to the third scan line 154. A first electrode Ea7 of the seventh transistor T7 may be electrically connected to the second electrode Eb6 of the sixth transistor T6 and the anode of the light emitting diode LED. A second electrode Eb7 of the seventh transistor T7 may be electrically connected to the terminal of the initialization voltage Vint and the first electrode Ea4 of the fourth transistor T4.

The transistors T1, T2, T3, T4, T5, T6, and T7 may each be a P-type channel transistor such as a PMOS, however the transistors T1, T2, T3, T4, T5, T6, and T7 are not limited thereto, and at least one of the transistors T1, T2, T3, T4, T5, T6, and T7 may be an N-type channel transistor.

As above-described, the terminal of the capacitor Cst may be electrically connected to the gate electrode G1 of the first transistor T1, and another terminal thereof may be electrically connected to the driving voltage line 172. A cathode of the light emitting diode LED may be electrically connected to a terminal of a common voltage ELVSS transmitting the common voltage ELVSS, thereby receiving the common voltage ELVSS.

Although it has been described above that one pixel PX includes seven transistors (e.g., T1 to T7), one storage capacitor Cst, and one light emitting diode LED, this is only an example, and the number of transistors, the number of capacitors, the number of light emitting diodes LEDs, and connection relationship thereof may be variously changed.

Description of the method of manufacturing the display device according to an embodiment is provided with reference to FIGS. 5 to 11 below.

FIGS. 5 to 11 are schematic cross-sectional views showing a manufacturing process of a display device according to an embodiment in order.

Figure 5:
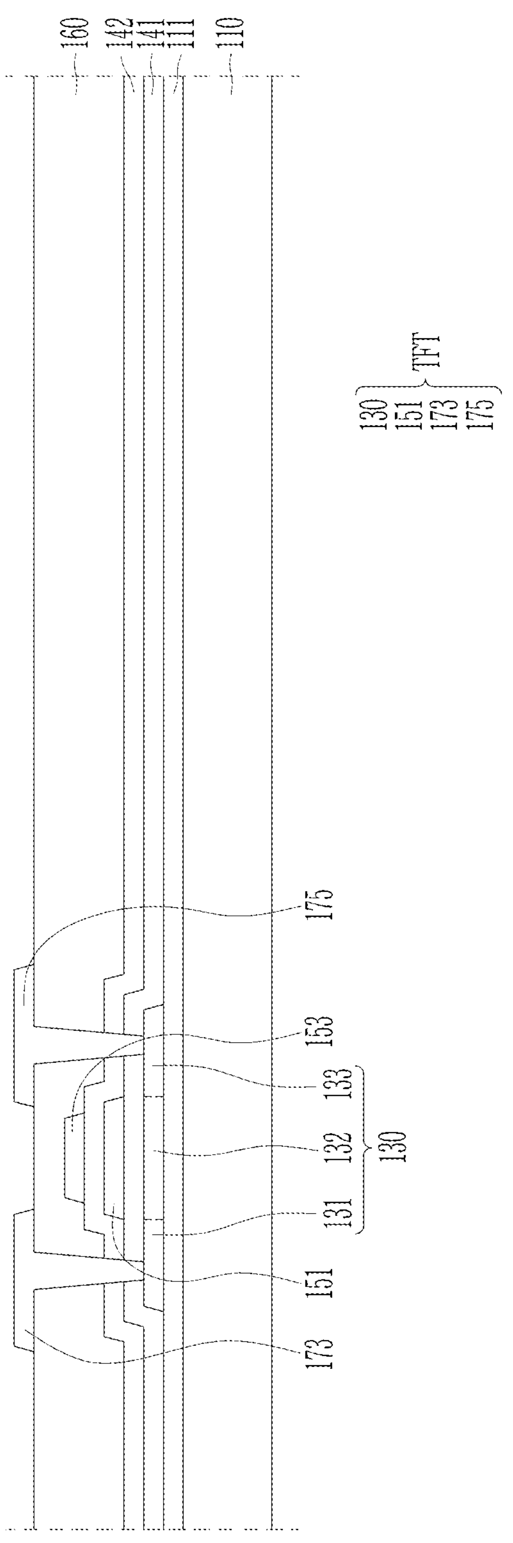
FIGS. 5 to 11 are schematic cross-sectional views showing a method of manufacturing a display device according to an embodiment.

Referring to FIG. 5, a buffer layer 111 may be formed on a substrate 110 by using an inorganic insulating material or an organic insulating material. A semiconductor 130 may be formed on the buffer layer 111 by using a semiconductor material. The semiconductor material of the semiconductor 130 may be made of amorphous silicon, polysilicon, an oxide semiconductor, or the like. A first gate insulating layer 141 may be formed on the semiconductor 130 and the buffer layer 111 by using an inorganic insulating material.

A metal material may be deposited and patterned on the first gate insulating layer 141 to form a gate electrode 151. The gate electrode 151 may overlap the semiconductor 130 in a plan view. After forming the gate electrode 151, a doping process or plasma treatment is performed on a portion of the semiconductor 130 that does not overlap the gate electrode 151 in a plan view. Accordingly, a portion of the semiconductor 130 overlapping the gate electrode 151 may become a channel 132, and the portion of the semiconductor 130 not overlapping the gate electrode 151 may become a first area 131 and a second area 133, which have electrical conductivity. The first area 131 and the second area 133 may be positioned on sides (e.g., both sides) of the channel 132 of the semiconductor 130, respectively. A second gate insulating layer 142 may be formed on the gate electrode 151 and the first gate insulating layer 141 by using an inorganic insulating material.

A metal material may be deposited and patterned on the second gate insulating layer 142 to form a first storage electrode 153. The first storage electrode 153 may overlap the gate electrode 151 in a plan view. An interlayer insulating layer 160 may be formed on the first storage electrode 153 and the second gate insulating layer 142 by using an inorganic insulating material or an organic insulating material. An opening exposing at least a portion of the first area 131 and the second area 133 of the semiconductor 130 may be formed by patterning the interlayer insulating layer 160.

A source electrode 173 and a drain electrode 175 may be formed by depositing and patterning a metal material on the interlayer insulating layer 160. The source electrode 173 may be electrically connected to the first area 131 of the semiconductor 130 through the opening. The drain electrode 175 may be electrically connected to the second area 133 of the semiconductor 130 through the opening. The metal material of the source electrode 173 and the drain electrode 175 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (T1), tungsten (W), and copper (Cu), and the like.

Figure 6:
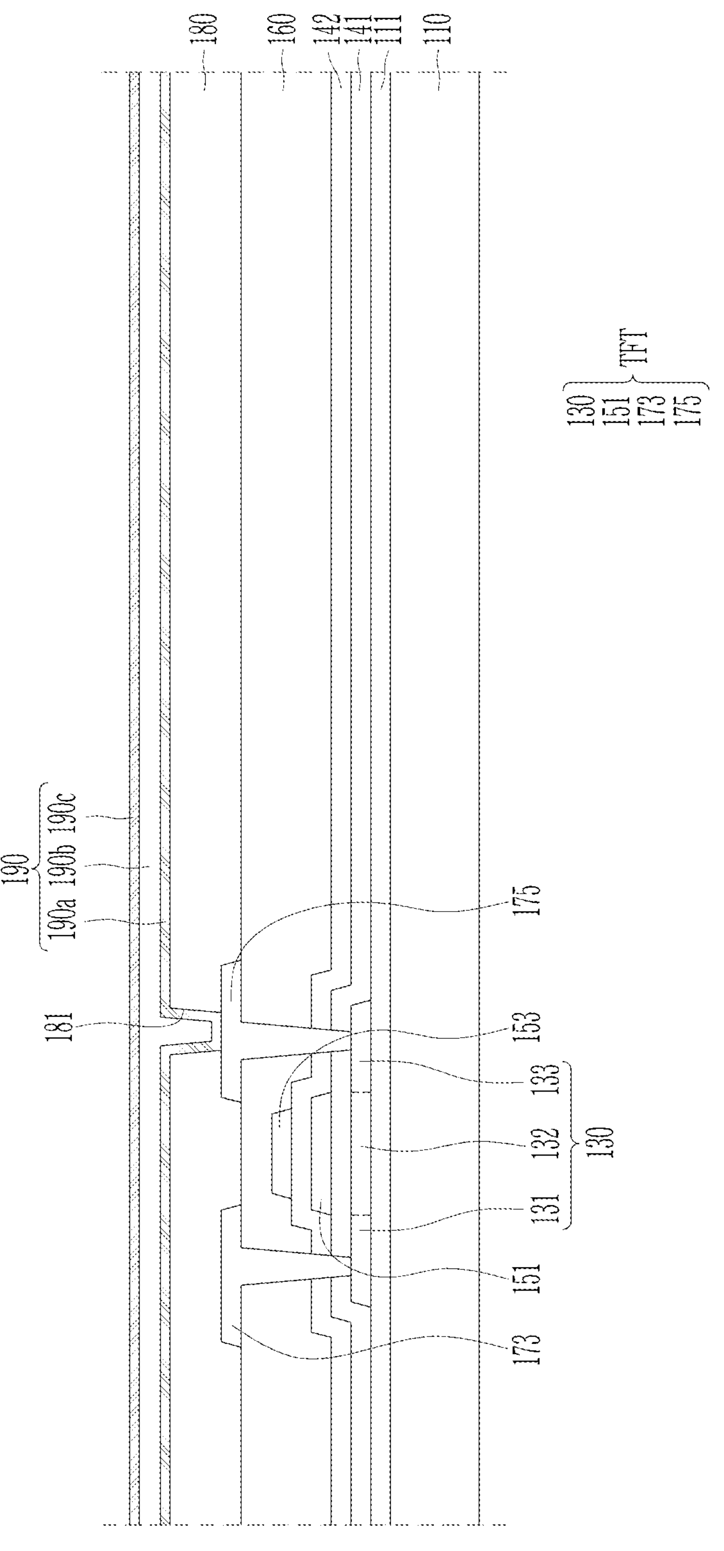

Referring to FIG. 6, a passivation layer 180 may be formed on the source electrode 173 and the drain electrode 175 by using an organic insulating material. The opening 181 may be formed by patterning the passivation layer 180. At least a portion of the drain electrode 175 may be exposed by the opening 181.

A conductive layer (or conductive material layer) 190 may be formed on the passivation layer 180. The conductive layer 190 may be composed of a single layer including a transparent conductive oxide film or a metal material, or a multi-layer including the above-described materials. For example, the conductive layer 190 may include a first conductive layer 190*a*, a second conductive layer 190*b*, and a third conductive layer 190*c*. The first conductive layer 190*a* may be made of ITO. The second conductive layer 190*b* may be made of silver (Ag). The third conductive layer 190*c* may be made of ITO.

The conductive layer 190 may be positioned (e.g., directly positioned) above the passivation layer 180. The conductive layer 190 may also be formed in the opening 181 of the passivation layer 180. The conductive layer 190 may be electrically connected to the drain electrode 175 through the opening 181. For example, a bottom surface of the first conductive layer 190*a* may be in contact with the drain electrode 175.

Figure 7:
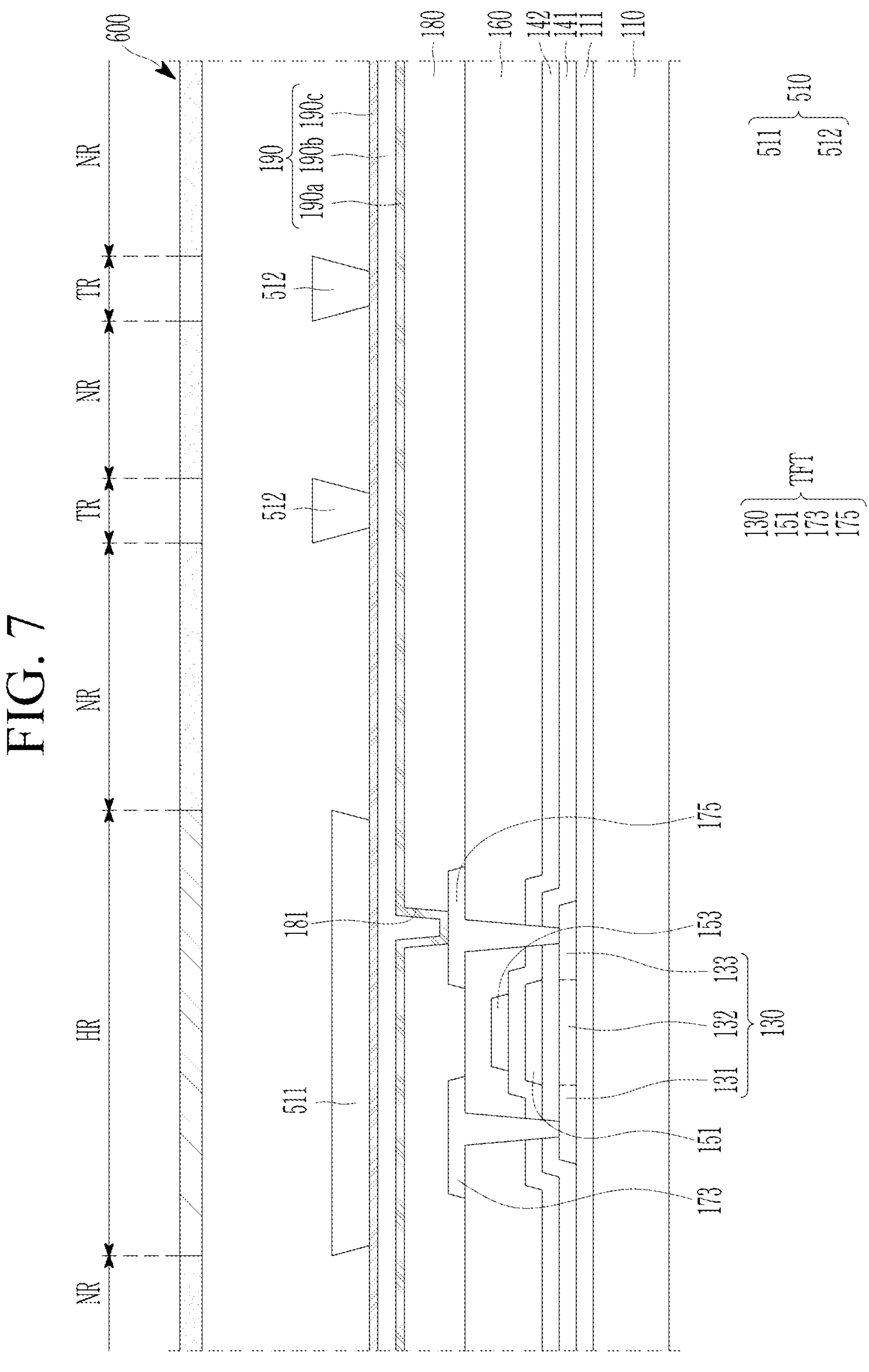

Referring to FIG. 7, a photoresist pattern 510 may be formed by coating a photosensitive resin may be coated on the conductive layer 190, aligning a mask 600 may be aligned on the substrate 110, and performing a photo process. The photosensitive resin may be a resin composed of a polymer that is dissolved or changed to an insoluble state by a photochemical reaction.

The mask 600 may include a transmissive part TR that transmits light (e.g., most of light) incident on the mask 600, a semi-transmissive part HR that transmits only some light, and a non-transmissive part NR that blocks light (e.g., most of the light). The photoresist pattern 510 may be formed of a negative photoresist. During a development process, a portion (e.g., second portion 512) of the photosensitive resin corresponding to the transmissive portion TR of the mask 600 may remain on the conductive layer 190, a thickness of a portion (e.g., first portion 511) of the photosensitive resin corresponding to the semi-transmissive portion HR may be reduced, and a portion of the photosensitive resin corresponding to the non-transmissive portion NR may be removed. Accordingly, the photoresist pattern 510 may include a first portion 511 having a first thickness and a second portion 512 having a second thickness. The second thickness may be thicker than the first thickness. The first portion 511 of the photoresist pattern 510 may be the portion corresponding to the semi-transmissive portion HR of the mask 600. The second portion 512 of the photoresist pattern 510 may be the portion corresponding to the transmissive portion TR of the mask 600. A side of the photoresist pattern 510 (e.g., first portion 511 and second portion 512) may be patterned to have a reversed taper shape.

Figure 8:
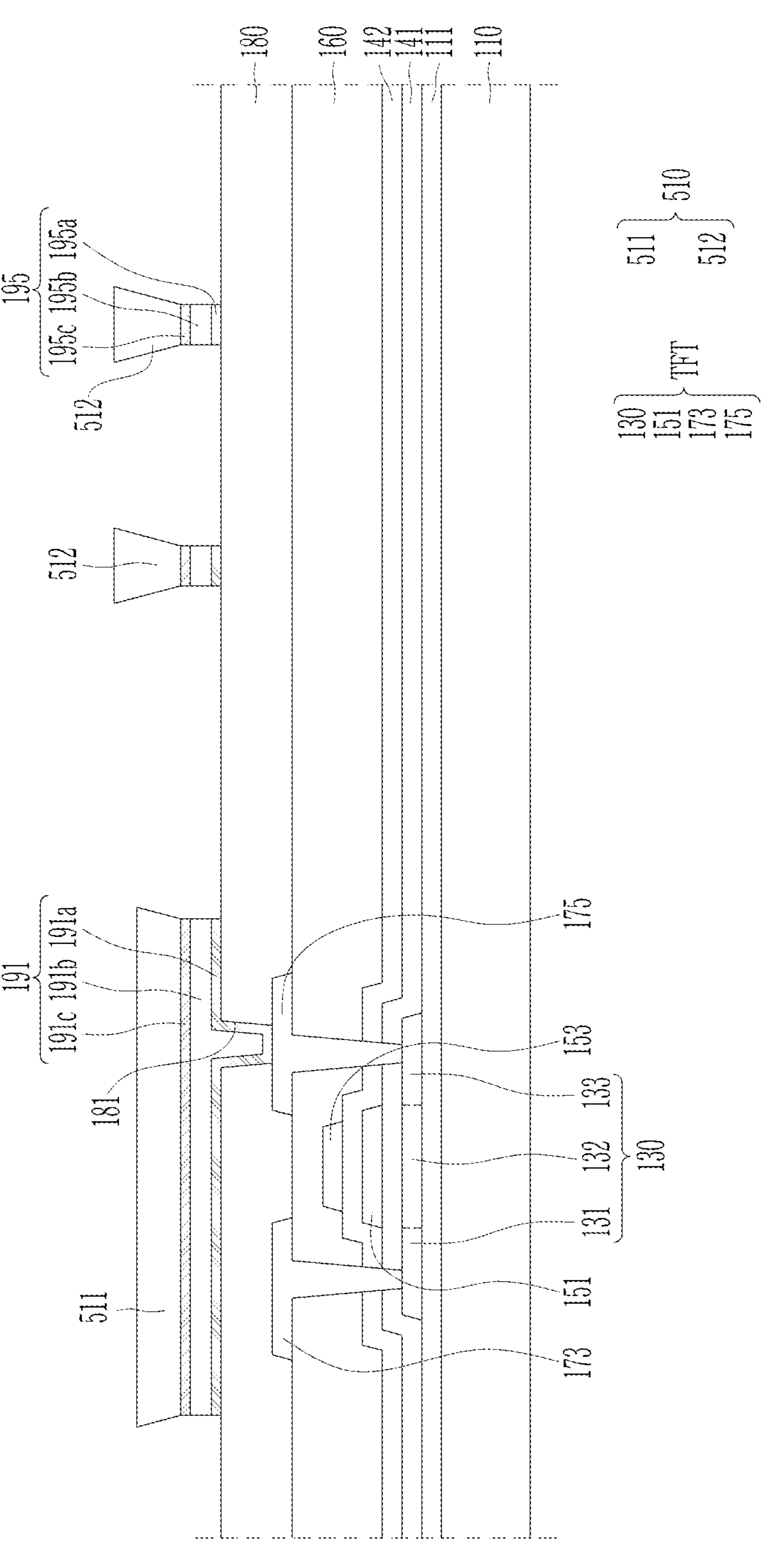

Referring to FIG. 8, the conductive layer 190 (e.g., refer to FIG. 7) may be etched using the photoresist pattern 510 (e.g., first portion 511 and second portion 512) as a mask (e.g., etch mask). By patterning the conductive material layer 190, a first electrode 191 and an electrode pattern layer 195 may be formed. A portion of the conductive layer 190 positioned under the first portion 511 of the photoresist pattern 510 may be the first electrode 191. The first electrode 191 may be electrically connected to the drain electrode 175 of the transistor TFT through the opening 181 of the passivation layer 180. The first electrode 191 may include a lower layer 191*a*, an intermediate layer 191*b*, and an upper layer 191*c*. The lower layer 191*a* of the first electrode 191 may be in contact with the drain electrode 175. A portion of the conductive layer 190 positioned under the second portion 512 of the photoresist pattern 510 may be the electrode pattern layer 195. The electrode pattern layer 195 may be spaced apart from the first electrode 191. The electrode pattern layer 195 may include a lower layer 195*a*, an intermediate layer 195*b*, and an upper layer 195*c*. The electrode pattern layer 195 and the first electrode 191 may be made of a same material and positioned on a same layer. The electrode pattern layer 195 and the first electrode 191 may be formed in a same process.

Figure 9:
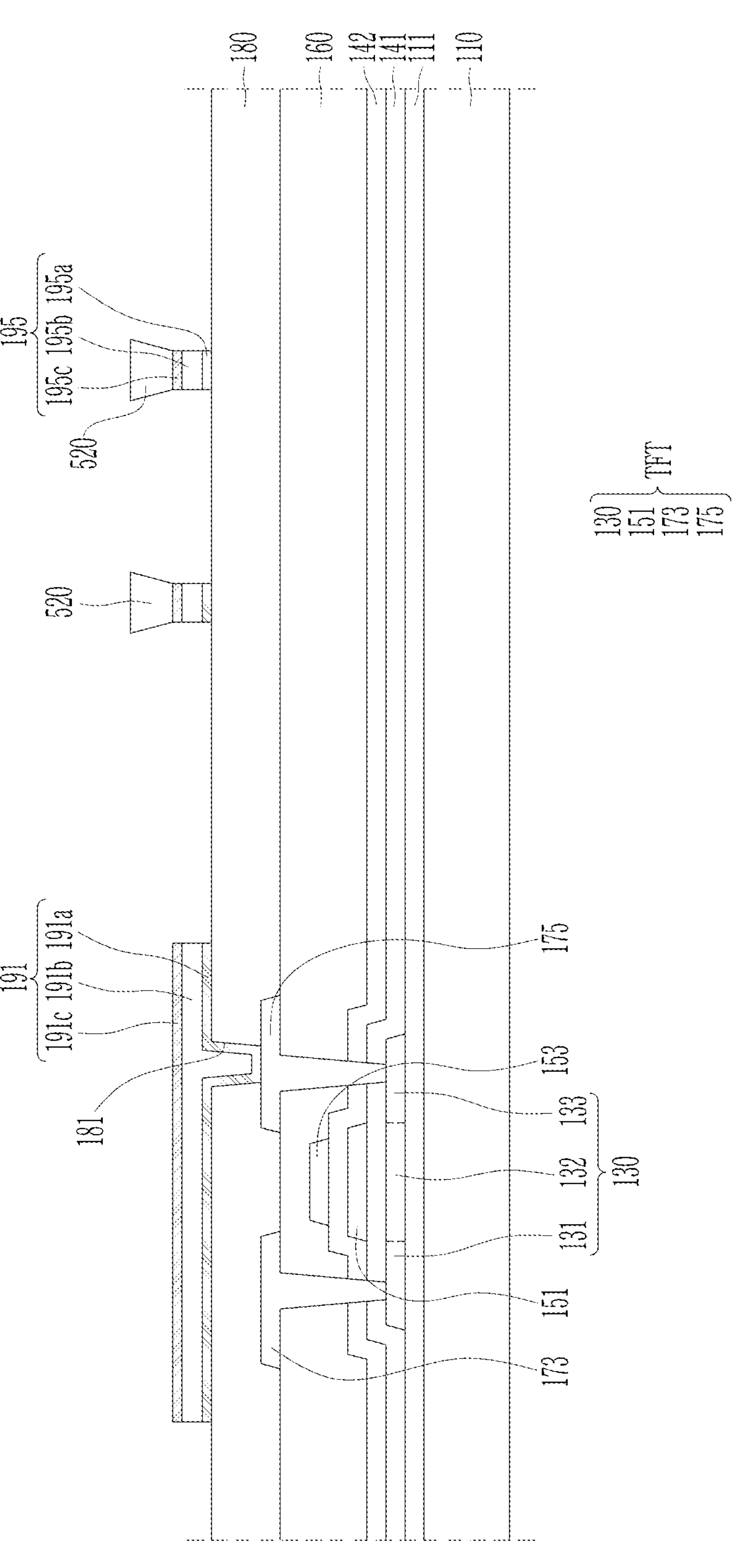

Referring to FIG. 9, the photoresist pattern 510 may be ashed to remove the first portion 511 of the photoresist pattern 510 positioned on the first electrode 191 and to form a photosensitive pattern layer 520 on the electrode pattern layer 195. The thickness of the second portion 512 of the photoresist pattern 510 positioned on the electrode pattern layer 195 may be reduced to form the photosensitive pattern layer 520. The photosensitive pattern layer 520 may be positioned (e.g., directly positioned) on the electrode pattern layer 195. The photosensitive pattern layer 520 may be in contact with the upper layer 195*c* of the electrode pattern layer 195. A side surface of the photosensitive pattern layer 520 may have a reversed taper shape. The photosensitive pattern layer 520 and the electrode pattern layer 195 may form a pattern part 700. The pattern part 700 may be spaced apart from the first electrode 191.

Figure 10:
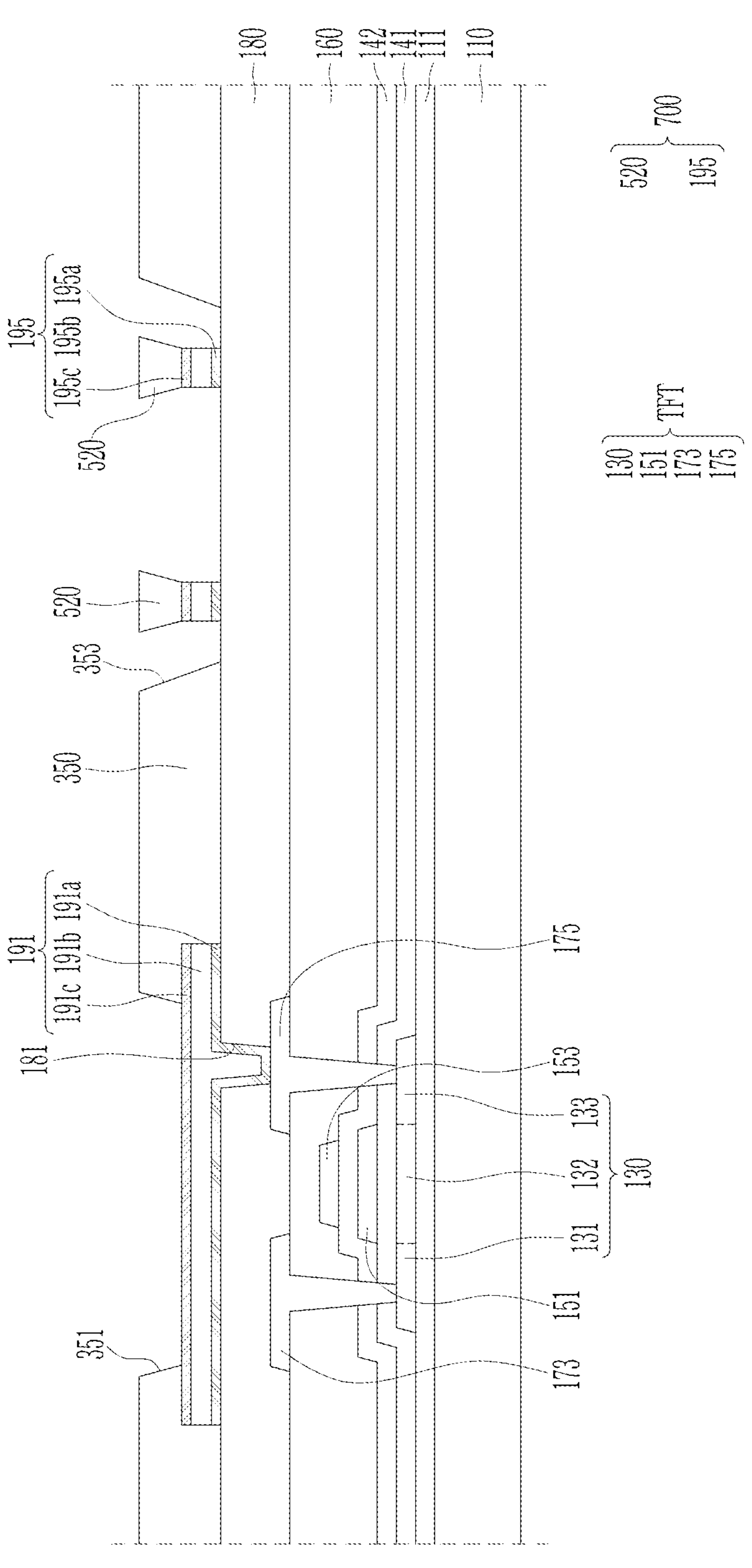

Referring to FIG. 10, a bank layer 350 may be formed on the first electrode 191 and the passivation layer 180 by using an organic insulating material. By patterning the bank layer 350, a pixel opening 351 and an opening 353 are formed. The pixel opening 351 may overlap the first electrode 191 in a plan view. The pixel opening 351 may overlap a central portion of the first electrode 191 in a plan view. The central portion of the first electrode 191 may be exposed by the pixel opening 351. Accordingly, the bank layer 350 may be positioned on an edge of the first electrode 191. The opening 353 may overlap the pattern part 700 and a peripheral area of the pattern part 700 in a plan view. Therefore, the bank layer 350 may not be positioned on the pattern part 700. The pattern part 700 may be spaced apart from the bank layer 350.

Figure 11:
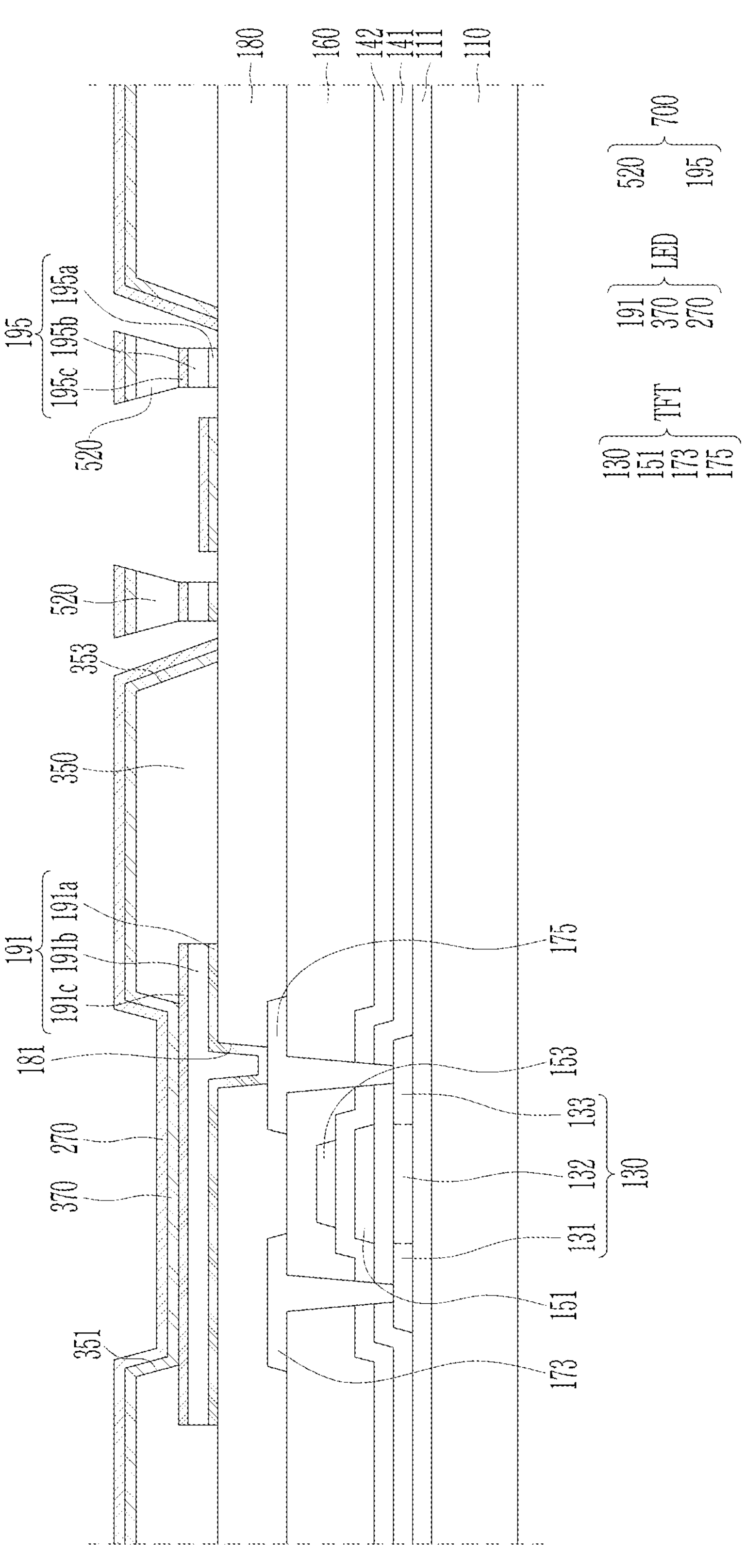

Referring to FIG. 11, an emission layer 370 may be formed on the first electrode 191. The emission layer 370 may be positioned entirely over the substrate 110. Accordingly, the emission layer 370 may also be positioned on the bank layer 350 and the pattern part 700. Also, the emission layer 370 may be positioned between pattern parts 700 (e.g., adjacent pattern parts 700). The emission layer 370 may be positioned (e.g., directly positioned) above the passivation layer 180 between the pattern parts 700.

The emission layer 370 may be formed by sequentially depositing layers. As shown in FIG. 3, the emission layer 370 may include light emission parts 1370 and 2370, and a charge generation layer 375 positioned between the light emission parts 1370 and 2370. Some of the layers of the emission layer 370 may be positioned only within the pixel opening 351, and other portions of the layers of the emission layer 370 may be formed entirely on the substrate 110. However, the disclosure is not limited thereto, and the layers may be formed entirely on the substrate 110.

A second electrode 270 may be formed on the emission layer 370 by using a conductive material. The second electrode 270 may be formed of a transparent conductive oxide film, a translucent conductive material, or the like. The second electrode 270 may be positioned (e.g., directly positioned) on the emission layer 370 and may be entirely formed on the substrate 110.

The emission layer 370 and the second electrode 270 may be positioned entirely on the substrate 110. At least some areas of the emission layer 370 and the second electrode 270 may have a shape that is separated from remaining areas thereof. A portion of the emission layer 370 positioned on the first electrode 191 may be separated from a portion of the emission layer 370 positioned on the pattern part 700. In the display device according to an embodiment, the portion of the emission layer 370 positioned on the first electrode 191 may be separated from the portion of the emission layer 370 positioned on the pattern part 700, so that even if leakage occurs in the charge generation layer 375 of the emission layer 370, a transmission path of the leakage may be blocked, and a color change in a low grayscale may be improved. A portion of the second electrode 270 positioned on the first electrode 191 may be separated from a portion of the second electrode 270 positioned on the pattern part 700. The emission layer 370 and the second electrode 270 may be separated from an edge of the pattern part 700 by a step difference between the pattern part 700 and a periphery of the pattern part 700. The portion of the emission layer 370 and the second electrode 270 positioned on the pattern part 700 may be separated from the portion of the emission layer 370 and the second electrode 270 positioned outside the pattern part 700. Some of the layers constituting the emission layer 370 may not be separated, but may be connected as a whole. For example, the first light emission part 1370 and the charge generation layer 375 may have a separated form on the edge of the pattern part 700, and the second light emission part 2370 may have a connected form on the edge of the pattern part 700. Likewise, the second electrode 270 may be connected as a whole. For example, the second electrode 270 may have a connected shape with the edge of the pattern part 700.

Figure 12:
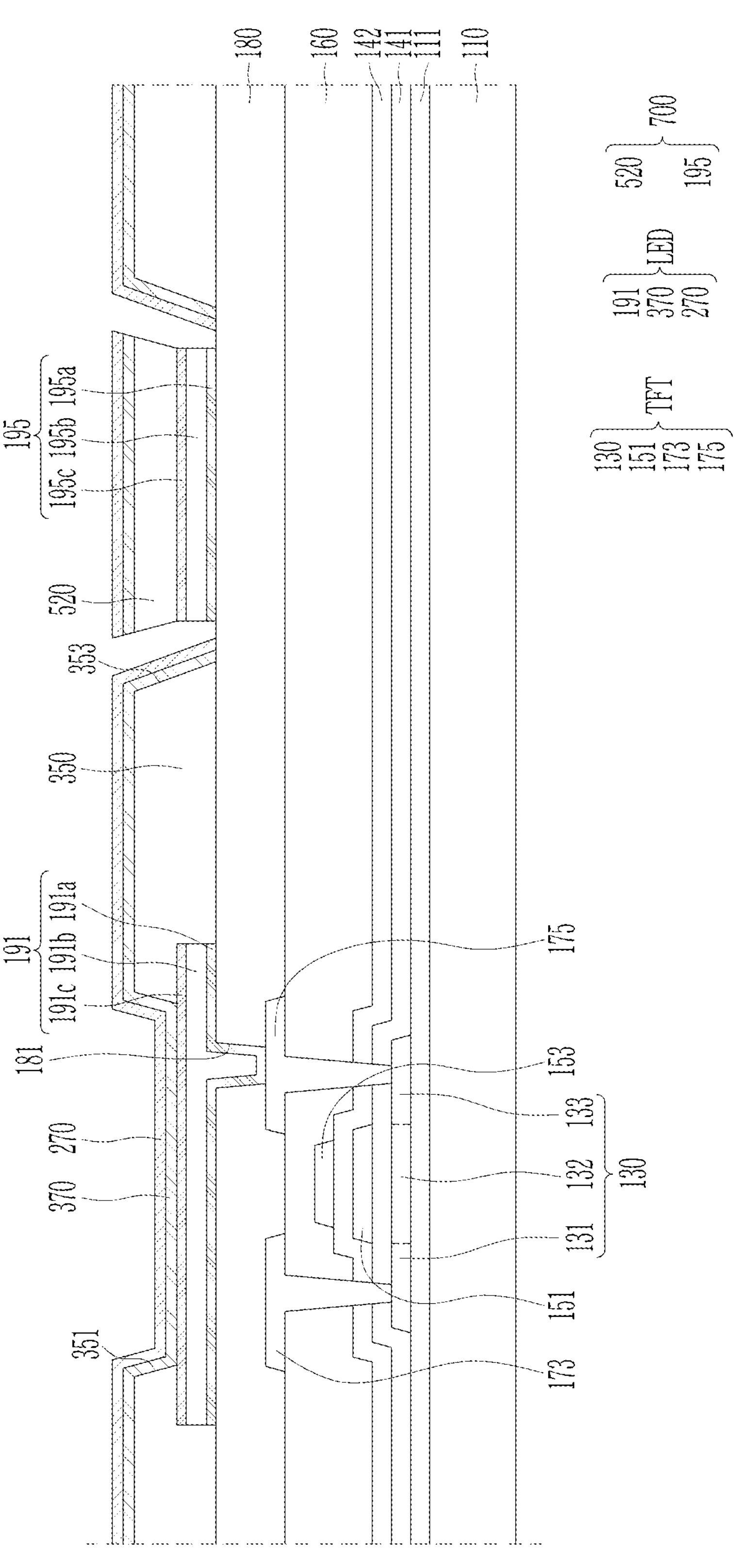
FIG. 12 is a schematic cross-sectional view showing a display device according to an embodiment.
Figure 13:
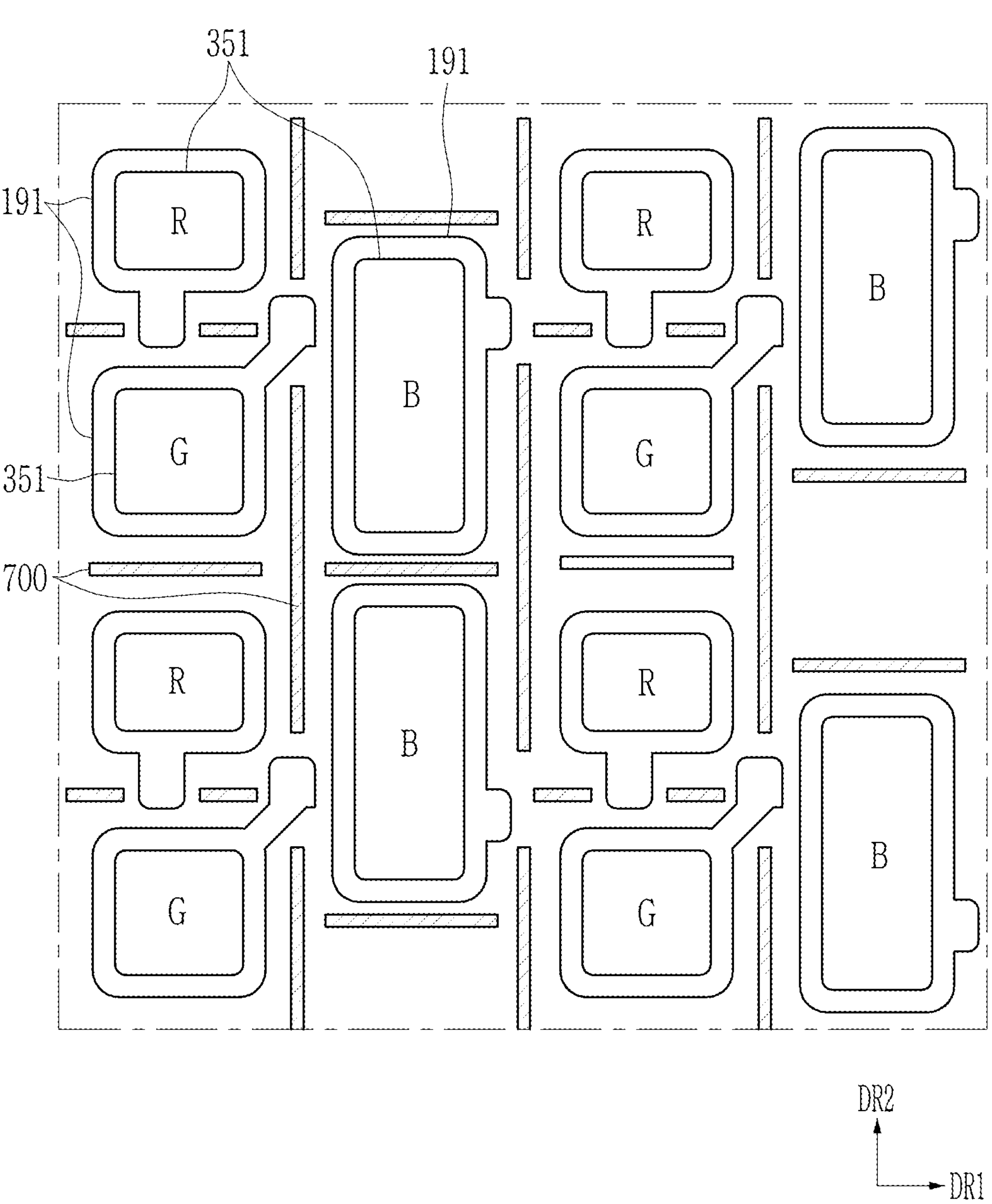
FIG. 13 is a schematic plan view showing some layers of a display device according to an embodiment.

Description of the display device according to an embodiment is provided with reference to FIGS. 12 and 13.

Figure 3:
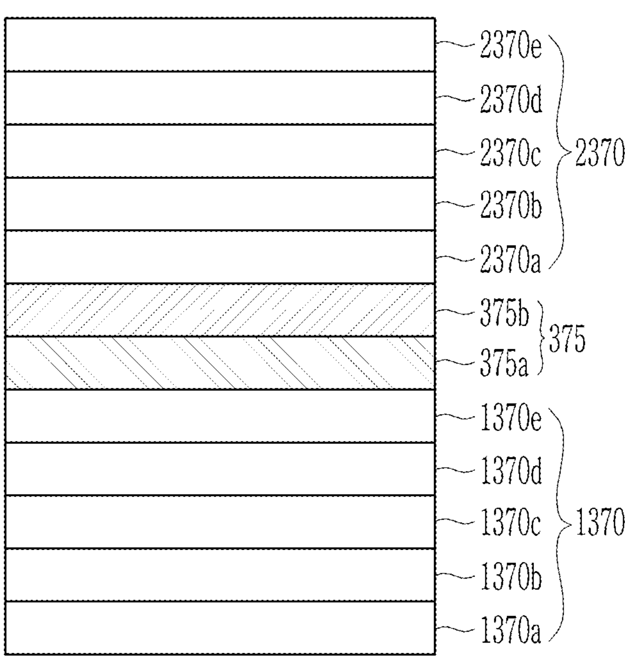
FIG. 3 is a schematic view showing layers included in some layers of FIG. 1.

The display device according to an embodiment shown in FIGS. 12 and 13 is different from the display device according to the embodiment shown in FIGS. 1 to 3 at least in that the number of pattern parts positioned between two adjacent pixels is reduced. Thus, detailed description of the same elements is omitted.

FIG. 12 is a schematic cross-sectional view showing a display device according to an embodiment. FIG. 13 is a schematic plan view showing some layers of a display device according to an embodiment. FIG. 13 shows a first electrode and a pattern part of a display device acceding to an embodiment.

Referring to FIGS. 12 and 13, the display device according to an embodiment includes a substrate 110, a transistor TFT positioned on the substrate 110, a first electrode 191 electrically connected to the transistor TFT, an emission layer 370 disposed on the first electrode 191, a second electrode 270 positioned on the emission layer 370, and a pattern part 700 separated from the first electrode 191. The pattern part 700 may include an electrode pattern layer 195 and a photosensitive pattern layer 520.

At least one pattern part 700 may be positioned between adjacent pixels R, G, and B. In the preceding embodiment, one, two, or four pattern parts 700 may be positioned between the adjacent pixels R, G, and B, and in the embodiment, one or two pattern parts 700 may be positioned between the adjacent pixels R, G, and B. In most areas, a single pattern part 700 may be positioned between the adjacent pixels R, G, and B. A width of the pattern part 700 in the embodiment may be wider than a width of the pattern part 700 in the previous embodiment. For example, the width of pattern part 700 in the embodiment may be made wider than two widths of the pattern parts 700 in the preceding embodiment. However, this is only an example, and the number of the pattern parts 700 positioned between the adjacent pixels R, G, and B and the width of each pattern part 700 may be variously changed. The width of the pattern parts 700 may be constant or different from each other.

Description of the display device according to an embodiment is provided with reference to FIGS. 14 to 18.

The display device according to an embodiment shown in FIGS. 14 to 18 is different from the display device according to the embodiment shown in FIGS. 1 to 3 at least in that the substrate includes an opening area. Thus, detailed description of the same elements is omitted.

Figure 14:
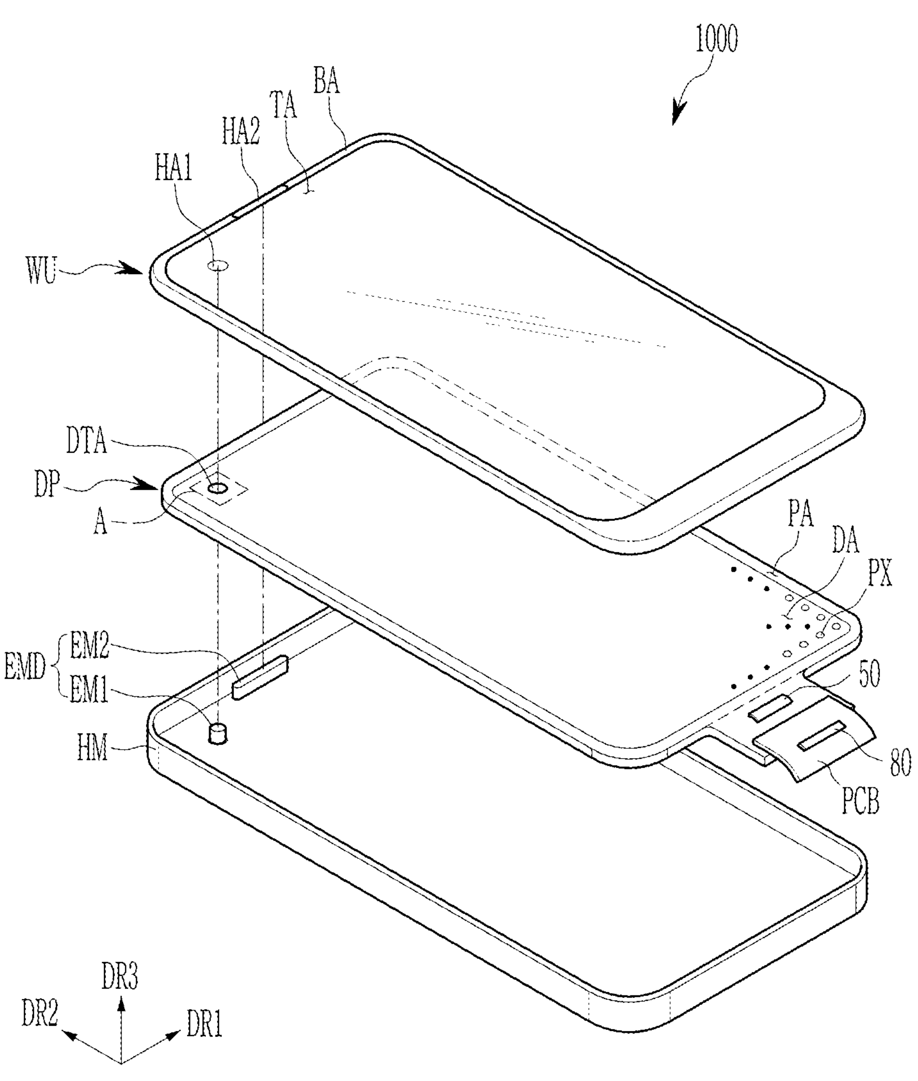
FIG. 14 is a schematic exploded perspective view of a display device according to an embodiment.
Figure 15:
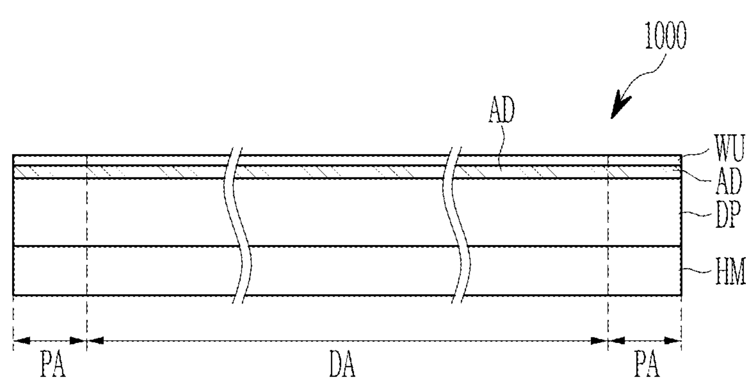
FIG. 15 is a schematic cross-sectional view of a display device according to an embodiment.
Figure 15:
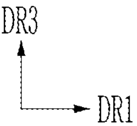
Figure 16:
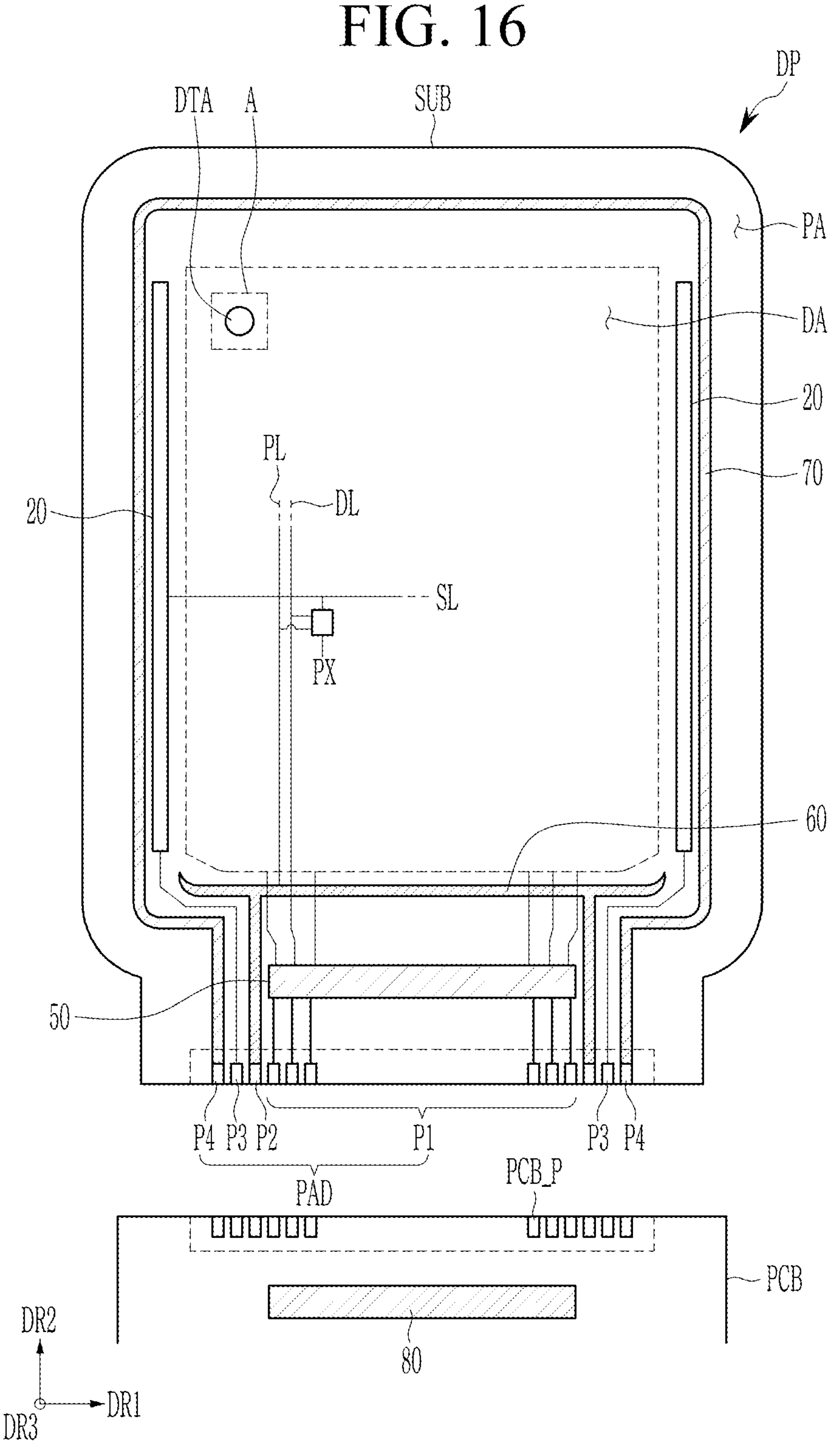
FIG. 16 is a schematic plan view showing some elements of a display device according to an embodiment.

FIG. 14 is a schematic exploded perspective view of a display device according to an embodiment. FIG. 15 is a schematic cross-sectional view of a display device according to an embodiment. FIG. 16 is a schematic plan view showing some elements of a display device according to an embodiment.

Referring to FIGS. 14 and 15, the display device 1000 may display an image toward a third direction DR3 on a plane defined by a first direction DR1 and a second direction DR2. A front surface (or upper surface) and a rear surface (or bottom surface) of each member may be distinguished by the third direction DR3. The directions indicated by the first to third directions DR1, DR2, and DR3 may be relative concepts and may be converted into other directions.

The display device 1000 may include a cover window WU, a display panel DP, and a housing member HM. In the embodiment, the cover window WU, the display panel DP, and the housing member HM may be combined to configure the display device 1000.

The cover window WU may be disposed on the display panel DP, and protect the display panel DP. The cover window WU may include a transmission area TA and a blocking area BA. The transmission area TA may be an optically transparent area and may be an area that transmits incident light. The blocking area BA may be an area having relatively low light transmittance compared to the transmission area TA. The blocking area BA may define a shape of the transmission area TA. The blocking area BA may surround the transmission area TA. The blocking area BA may represent a color. The blocking area BA may overlap a non-display area PA of the display panel DP in a plan view to block the non-display area PA from being viewed from the outside.

The cover window WU may include a first hole area HA1 and a second hole area HA2. Each of the first hole area HA1 and the second hole area HA2 may overlap an electronic module EMD in a plan view. Description of the electronic module EMD is provided below.

The electronic module EMD may receive external signals provided through the first hole area HA1 and the second hole area HA2, and may be operated by the external signals.

According to an embodiment, the first hole area HA1 may be positioned in the transmission area TA. The second hole area HA2 may be positioned in the blocking area BA. However, this is only illustrative and the first hole area HA1 and the second hole area HA2 may be positioned in opposite areas. In other embodiments, the first hole area HA1 and the second hole area HA2 may be positioned in the transmission area TA or the blocking area BA. Also, the number of the hole areas is not limited to two, and three or more hole areas may be formed in the transmission area TA or the blocking area BA. The first hole area HA1 may or may not be a physically formed hole. For example, no physical hole may be formed in the first hole area HAL and an area having high transmittance may be formed. The density of the pixels positioned in the first hole area HA1 may be different from the density of the pixels in other areas.

In each of the first hole area HA1 and the second hole area HA2, a depression recessed from the rear surface of the cover window WU may be defined. The depression may include a groove or an opening with a lower depth than a thickness of the cover window WU.

The first hole area HA1 and the second hole area HA2 may have different shapes. The first hole area HA1 may have a circular shape in a plan view, and the second hole area HA2 may have an elliptical shape having a long axis extending in the first direction DR1 in a plan view. However, the shapes of the first hole area HA1 and the second hole area HA2 are not limited thereto, and the size or shape of the first hole area HA1 and the second hole area HA2 may be variously modified.

The display panel DP may be a flat rigid display panel or a flexible display panel without being limited thereto. The display panel according to an embodiment may be a light emitting display panel, and is not limited thereto. For example, the display panel may be an organic light emitting panel or a quantum dot light emission display panel. An emission layer of the organic light emitting panel may include an organic light emission material. The emission layer of the quantum dot light emission display panel may include quantum dots, quantum rods, or the like. Hereinafter, the display panel is described as an organic light emitting panel.

The display panel DP may display an image on a front surface thereof. The front surface of the display panel DP may include a display area DA and a non-display area PA. The image may be displayed in the display area DA. The non-display area PA may surround the display area DA.

The display panel DP may include pixel PXs positioned in the display area DA. The pixels PX may display light in response to an electrical signal. The light displayed by the pixels PX may realize an image. The number of transistors and capacitors included in each pixel PX and the connection relationship thereof may be varied in different ways.

The display panel DP according to an embodiment may include an opening area DTA penetrating the display panel DP. The opening area DTA may be positioned on the display area DA. An area A where the opening area DTA is positioned is described later. The opening area DTA may overlap the first hole area HA1 of the cover window WU in a plan view. Some of pixels PX may be disposed surrounding the opening area DTA. Therefore, the image may also be displayed in an area adjacent to the opening area DTA.

The display panel DP may include the non-display area PA extended from the display area DA and including signal lines and a pad part. A data driver 50 may be positioned in the non-display area PA. According to an embodiment, the pad part of the non-display area PA may be electrically connected to a printed circuit board (PCB) including a driving chip 80. Description of the pad part is described below in more detail in FIG. 16.

Referring to FIG. 15, an adhesive layer AD that attaches the display panel DP and the cover window WU may be positioned between the display panel DP and the cover window WU. Although not shown in this specification, a touch part positioned between the display panel DP and the cover window WU may be further included. The touch part may be disposed on the display panel DP for a touchscreen function of the display device 1000. The touch part may include a touch electrode of various patterns, and may be a resistive film type or a capacitance type.

The electronic module EMD (e.g., refer to FIG. 14) may include various functional modules to operate the display device 1000. The electronic module EMD may be electrically connected to the display panel DP through a connector that is not shown. For example, the electronic module EMD may be a camera, a speaker, or a sensor for detecting light or heat.

The electronic module EMD (e.g., refer to FIG. 14) may include a first electronic module EM1 (e.g., refer to FIG. 14) and a second electronic module EM2 (e.g., refer to FIG. 14). The first electronic module EM1 may detect an external object received through the opening area DTA and the first hole area HA1. The first electronic module EM1 may receive external inputs (e.g., input signals) transmitted through the opening area DTA and the first hole area HA1 or provide outputs (e.g., output signals) through the opening area DTA and the first hole area HA1.

For example, the first electronic module EM1 (e.g., refer to FIG. 14) may be at least any one of a light emitting module, a light sensing module, and a photographing module. For example, the first electronic module EM1 may include at least one of a light emitting module that outputs infrared light, a CMOS sensor for infrared detection, and a camera module that photographs an external subject.

The second electronic module EM2 (e.g., refer to FIG. 14) may collect sound signals such as voice through the second hole area HA2 or provide sound signals such as processed voice to the outside. For example, the second electronic module EM2 may include at least one of an acoustic input module and an acoustic output module. The acoustic input module may include a microphone capable of receiving an acoustic signal. The acoustic output module may include a speaker that outputs sound data as a sound signal.

However, this is illustrated by way of example, and the electronic module EMD may consist of a single module. The electronic module EMD may further include a greater number of electronic modules. In other embodiments the electronic module EMD may be arranged in various arrangement relationships. However, the disclosure is not limited to any one embodiment.

The housing member HM may be disposed under the display panel DP. The housing member HM may be combined with the cover window WU to form the exterior of the display device 1000. The housing member HM may contain a material having relatively high rigidity. For example, the housing member HM may include frames and/or plates made of (or include) at least one of glass, plastic, and metal.

The housing member HM may provide an accommodation space. The display panel DP may be accommodated in the accommodation space, and protected from external impact.

Referring to FIG. 16, the display panel DP may include a substrate SUB including the display area DA and the non-display area PA. The non-display area PA may be defined along a border of the display area DA. For example, the non-display area PA may surround the display area DA.

The display panel DP may include pixels PX. Pixels PX may be disposed in the display area DA on the substrate SUB. Each pixel PX may include a light-emitting element and a driving circuit part electrically connected to the light-emitting element. Each pixel PX may emit light of a color (e.g., red, green, blue, or white), and may include an organic light emitting element (e.g., an organic light emitting diode) as an example.

The display panel DP may include signal lines and a pad part. The signal lines may include a scan line SL, a data line DL, a driving voltage line PL, or the like. The scan line SL may extend in the first direction DR1. The data line DL and the driving voltage line PL may extend in the second direction DR2.

The scan driver 20 may generate and transmit a scan signal to each pixel PX through the scan line SL. According to an embodiment, the scan driver 20 may be disposed on left and right sides of the display area DA. This specification shows a structure in which the scan driver 20 is disposed on sides (e.g., both sides) of the substrate SUB, but in another embodiment, the scan driver may be disposed only on a side of the substrate SUB.

The pad part PAD may be disposed on an end of the display panel DP and include terminals P1, P2, P3, and P4. The pad part PAD may be exposed without being covered by an insulating layer, and may be electrically connected to the printed circuit board (PCB). The pad part PAD may be electrically connected to the pad part PCB_P of the printed circuit board (PCB). The printed circuit board (PCB) may transmit a signal or power of the driving chip (e.g., IC driving chip) 80 to the pad part PAD.

The controller may convert image signals transmitted from the outside into image data signals and transmit the converted signals to the data driver 50 through the terminal P1. The controller may receive a vertical synchronization signal, a horizontal synchronizing signal, and a clock signal, and generate control signals for controlling the driving of the scan driver 20 and the data driver 50. Thus, the controller may transmit the control signals (e.g., vertical synchronization signal, horizontal synchronizing signal, and clock signal) through the terminals P3 and P1, respectively. The controller may transmit a driving voltage ELVDD to a driving voltage supply wiring 60 through the terminal P2. The controller may transmit a common voltage ELVSS to each common voltage supply wiring 70 through the terminal P4.

The data driver 50 may be disposed on the non-display area PA, and generate and transmit a data signal to each pixel PX. For example, the data driver 50 may be disposed on a side of the display panel DP, and may be disposed between the pad part PAD and the display area DA.

The driving voltage supply wiring 60 may be disposed on the non-display area PA. For example, the driving voltage supply wiring 60 may be disposed between the data driver 50 and the display area DA. The driving voltage supply wiring 60 may provide the driving voltage ELVDD to the pixels PX. The driving voltage supply wiring 60 may be disposed in the first direction DR1, and may be electrically connected to driving voltage lines PL disposed in the second direction DR2.

The common voltage supply wiring 70 may be disposed on the non-display area PA. The common voltage supply wiring 70 may have a shape surrounding the substrate SUB. The common voltage supply wiring 70 may transmit the common voltage ELVSS to an electrode (e.g., a second electrode) of the light-emitting element included in the pixel PX.

Figure 17:
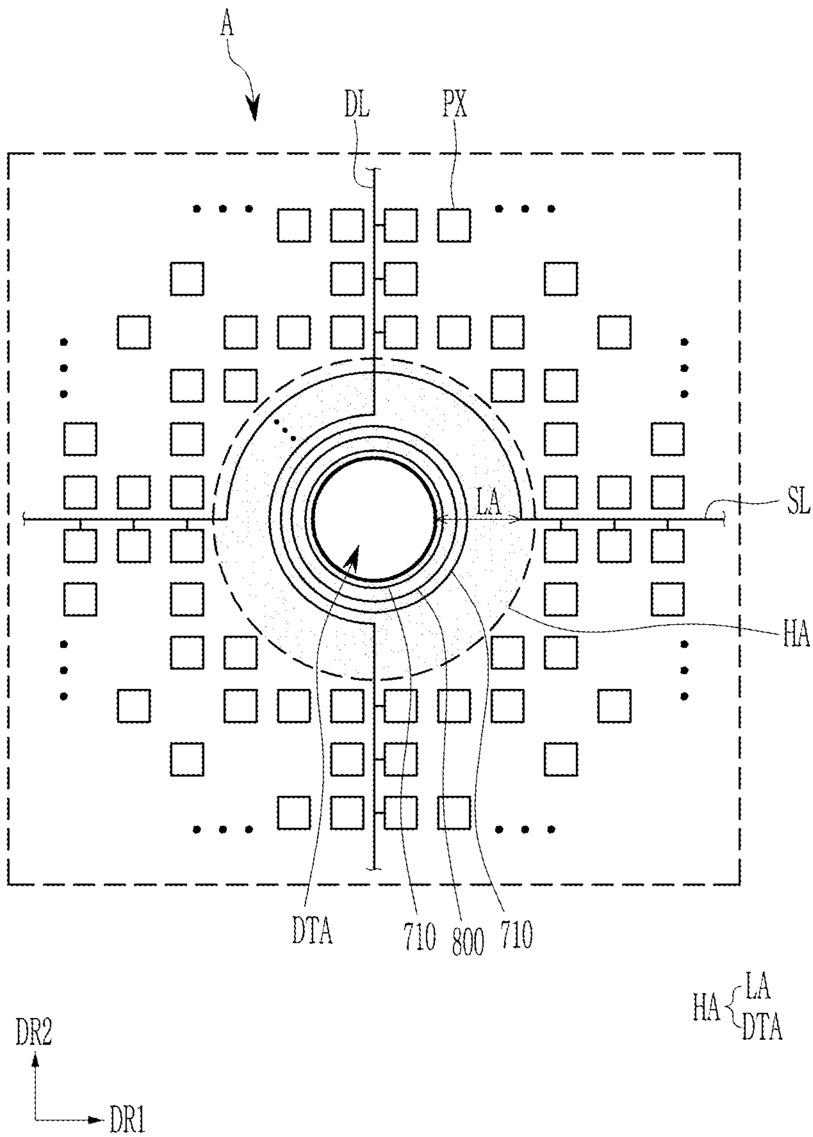
FIG. 17 is a schematic enlarged plan view of area A of FIGS. 14 and 16.

The area A including the opening area DTA shown in FIG. 16 is described with reference to FIG. 17. FIG. 17 is a schematic enlarged plan view of area A of FIGS. 14 and 16.

Referring to FIG. 17 and the above-described drawings, the display panel DP may include the signal lines SL and DL and the pixels PX, which are disposed on the substrate. Each of the pixels PX may be electrically connected to the signal lines SL and DL. FIG. 17 describes the scan line SL and the data line DL among the signal lines as an example. However, this is illustrated as an example, and each pixel PX according to an embodiment may be additionally connected to various signal lines and is not limited to any one embodiment.

The hole area HA included in the display panel DP may include an opening area DTA and a peripheral area LA surrounding the opening area DTA.

The peripheral area LA may be an area surrounding the periphery of the opening area DTA. The peripheral area LA may be positioned between the opening area DTA and the display area DA. The peripheral area LA may prevent damage to the wirings in case that a laser is irradiated to form the opening area DTA. The peripheral area LA needs to be kept at a minimum constant width.

The dam 800 and the auxiliary pattern part 710 may be positioned in the peripheral area LA. For example, the auxiliary pattern part 710 may be positioned around the dam 800, and may be spaced apart from the dam 800. The auxiliary pattern part 710 may be positioned on sides (e.g., both sides) of the dam 800.

The scan line SL and the data line DL may have a semicircular structure, overlap the peripheral area LA in a plan view, and may bypass the opening area DTA. Scan lines SL may extend in the horizontal direction along a periphery of the opening area DTA. Scan lines SL may include a scan line, a light emission control line, an initialization voltage line, or the like according to a signal. Data lines DL may extend in the vertical direction along the periphery of the opening area DTA. The data lines DL may be composed of a driving voltage line and a driving low voltage line according to a signal. According to an embodiment, the scan lines SL and the data lines DL may be changed.

Hereinafter, description of the portion surrounding the opening area DTA is further provided with reference to FIG. 18.

Figure 18:
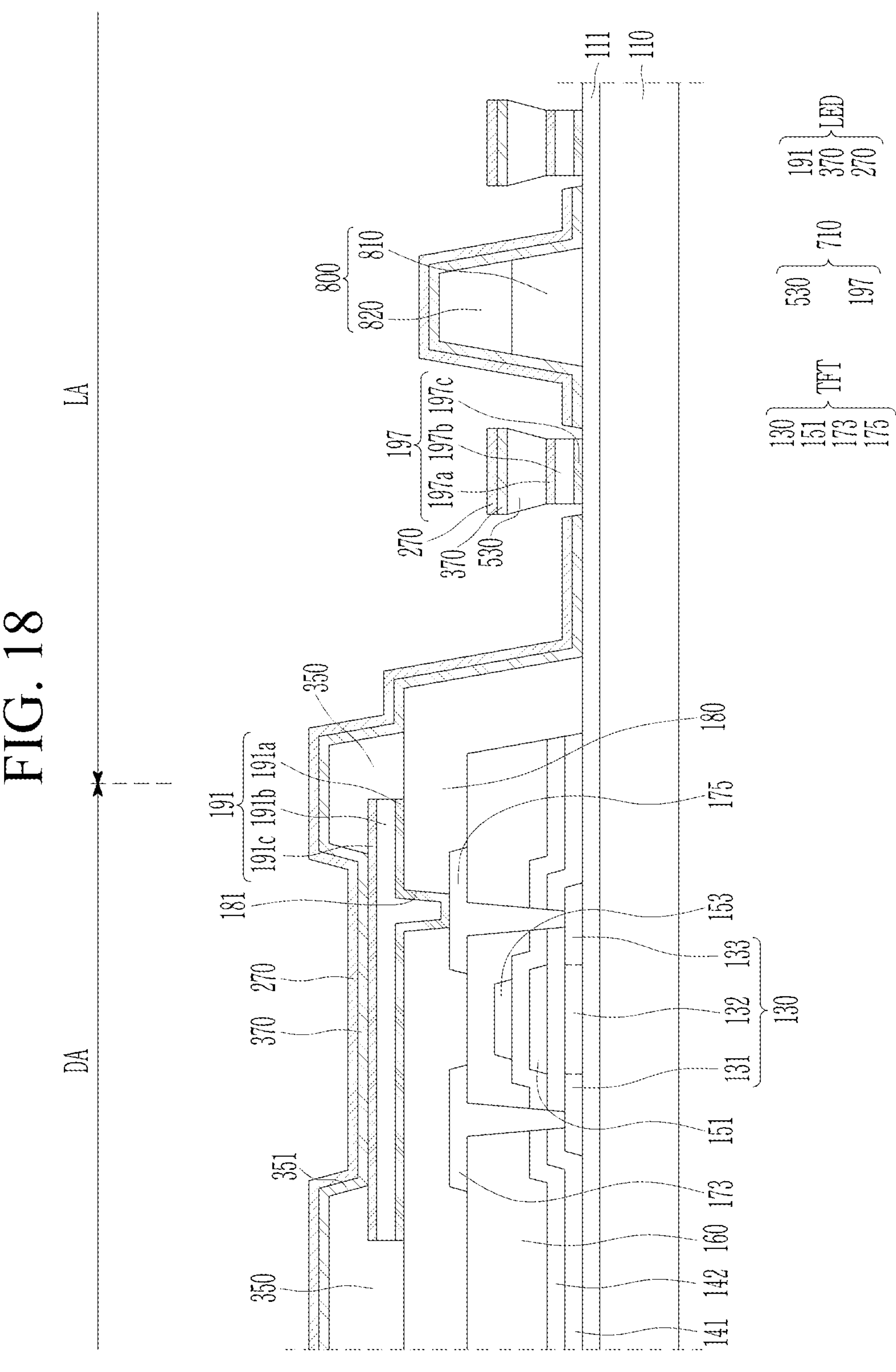
FIG. 18 is a schematic cross-sectional view of a display area and a peripheral area of a display device according to an embodiment.

FIG. 18 is a schematic cross-sectional view of a display area and a peripheral area of a display device according to an embodiment.

Referring to FIG. 18, the display device according to an embodiment includes a substrate 110, a transistor TFT positioned on the display area DA of the substrate 110, a first electrode 191 electrically connected to the transistor TFT, an emission layer 370 positioned on the first electrode 191, and a second electrode 270 positioned on the emission layer 370.

A buffer layer 111 may be positioned on the display area DA of the substrate 110 and extend to the peripheral area LA. A first gate insulating layer 141, a second gate insulating layer 142, an interlayer insulating layer 160, a passivation layer 180, and a bank layer 350 may be positioned on the display area DA and positioned on a boundary between the display area DA and the peripheral area LA. A passivation layer 180 may cover side surfaces of ends of the first gate insulating layer 141, the second gate insulating layer 142, and the interlayer insulating layer 160.

A dam 800 may be positioned on the peripheral area LA of the substrate 110. An auxiliary pattern part 710 may be positioned around the dam 800. The dam 800 and the auxiliary pattern part 710 may be placed on the buffer layer 111. Although one dam 800 and two auxiliary pattern parts 710 are shown in FIG. 18, the numbers of the dams 800 and the auxiliary pattern parts 710 are not limited thereto, and may be variously changed. For example, multiple dams 800 may be formed, and auxiliary pattern parts 710 may be positioned between the display areas DA and the dam 800. The auxiliary pattern parts 710 may be positioned between the dam 800 and an opening area (e.g., DTA of FIG. 17). For example, four to eight auxiliary pattern parts 710 may be formed between the dam 800 and the opening area, and some auxiliary pattern parts 710 may be removed in the process of forming the opening area.

The dam 800 may include a first layer 810 and a second layer 820, and the second layer 820 may be positioned on the first layer 810. The first layer 810 and the passivation layer 180 may be made of a same material and positioned on a same layer. The second layer 820 and the bank layer 350 may be made of a same material and positioned on a same layer. However, this is only an example, and the dam 800 may be formed of a single layer or may be formed of three or more layers. A material of the layer constituting the dam 800 may be variously changed.

The auxiliary pattern part 710 may be positioned around the dam 800 and spaced apart from the dam 800. The auxiliary pattern part 710 may include an electrode auxiliary pattern layer 197 and a photosensitive auxiliary pattern layer 530.

The electrode auxiliary pattern layer 197 and the first electrode 191 may be made of a same material and may be positioned on a same layer. The electrode auxiliary pattern layer 197 may be composed of a single layer including a transparent conductive oxide film or a metal material. In other embodiments, the electrode auxiliary pattern layer 197 may include a multi-layer including the above-described materials. For example, the electrode auxiliary pattern layer 197 may include a lower layer 197*a*, an intermediate layer 197*b*, and an upper layer 197*c*. The lower layer 197*a* of the electrode auxiliary pattern layer 197 may be positioned (e.g., directly positioned) on the buffer layer 111. The intermediate layer 197*b* may be positioned on the lower layer 197*a*. The upper layer 197*c* may be positioned on the intermediate layer 197*b*. The lower layer 197*a* of the electrode auxiliary pattern layer 197 and the lower layer 191*a* of the first electrode 191 may be made of a same material and may be positioned on a same layer. The intermediate layer 197*b* of the electrode auxiliary pattern layer 197 and the intermediate layer 191*b* of the first electrode 191 may be made of a same material and may be positioned on a same layer. The upper layer 197*c* of the electrode auxiliary pattern layer 197 and the upper layer 191*c* of the first electrode 191 may be made of a same material and may be positioned on a same layer. The intermediate layer 197*b* of the electrode auxiliary pattern layer 197 may be made of a different material from the lower layer 197*a* and/or the upper layer 197*c*. For example, the intermediate layer 197*b* may be made of silver (Ag), and the lower layer 197*a* and the upper layer 197*c* may be made of ITO.

The photosensitive auxiliary pattern layer 530 may be made of a photosensitive resin, and may be placed on the electrode auxiliary pattern layer 197. The photosensitive auxiliary pattern layer 530 and a photoresist used in the process of patterning the first electrode 191 may be made of a same material. The photosensitive auxiliary pattern layer 530 may be placed (e.g., directly placed) above the electrode auxiliary pattern layer 197. The photosensitive auxiliary pattern layer 530 may be in contact with an upper surface of the upper layer 197*c* of the electrode auxiliary pattern layer 197. A side of the photosensitive auxiliary pattern layer 530 may have a reversed taper shape in a cross-sectional view. For example, a width of an upper surface of the photosensitive auxiliary pattern layer 530 may be wider than a width of a bottom surface (e.g., lower surface) thereof. The width of the photosensitive auxiliary pattern layer 530 may be gradually narrowed from a top surface (e.g., upper surface) to a bottom surface (e.g., lower surface) thereof.

Also, as in the previous embodiment, the display device according to an embodiment may further include a pattern part (e.g., 700 of FIG. 12) spaced apart from the first electrode 191. The auxiliary pattern part 710 and the pattern part may be made of a same material and may be positioned on a same layer. The electrode auxiliary pattern layer 197 of the auxiliary pattern part 710 and the electrode pattern layer of the pattern part may be made of a same material and may be positioned on a same layer. The photosensitive auxiliary pattern layer 530 of the auxiliary pattern part 710 and the photosensitive pattern layer of the pattern part may be made of a same material and may be positioned on a same layer. However, the disclosure is not limited thereto, and the pattern part may be omitted.

The emission layer 370 and the second electrode 270 may be positioned entirely on the substrate 110. At least some areas of the emission layer 370 and the second electrode 270 may have a shape separated from remaining areas thereof. A portion of the emission layer 370 positioned on the first electrode 191 may be separated from a portion of the emission layer 370 positioned on the auxiliary pattern part 710. For example, a portion of the emission layer 370 positioned in the display area DA may be separated from a portion of the emission layer 370 positioned in the peripheral area LA. In the display device according to an embodiment, the portion of the emission layer 370 positioned in the display area DA may be separated from the portion of the emission layer 370 positioned in the peripheral area LA. Thus, a transmission path of a lateral leakage may be reduced, and a color change (e.g., optical characteristics of color change) may be improved in a low grayscale. A portion of the second electrode 270 positioned on the first electrode 191 may be separated from a portion of the second electrode 270 positioned on the auxiliary pattern part 710. The emission layer 370 and the second electrode 270 may be separated from an edge of the auxiliary pattern part 710. The portion of the emission layer 370 and the second electrode 270 positioned on the auxiliary pattern part 710 may be separated from the portion of the emission layer 370 and the second electrode 270 positioned outside the auxiliary pattern part 710. Some of the layers constituting the emission layer 370 may not be separated, but may be connected as a whole. Likewise, the second electrode 270 may be connected as a whole. For example, the second electrode 270 may have a connected form on the edge of the auxiliary pattern part 710.

Although not shown, an encapsulation layer may be further positioned on the second electrode 270.

The display device according to an embodiment is described with reference to FIG. 19 below.

Figure 19:
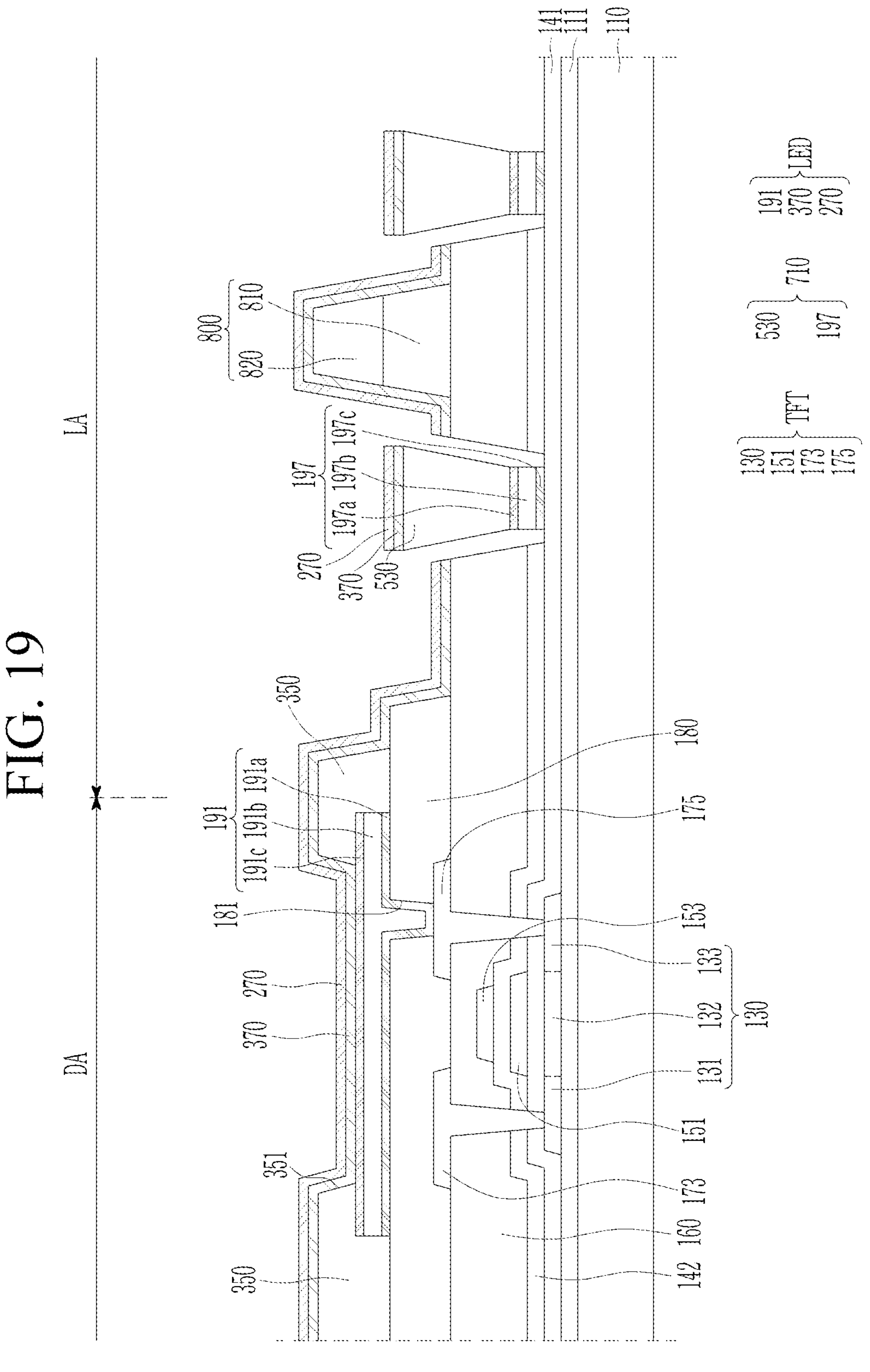
FIG. 19 is a schematic cross-sectional view showing a display device according to an embodiment.

The display device according to an embodiment shown in FIG. 19 is different from the display device according to the embodiment shown in FIGS. 14 to 18 at least in that the first gate insulating layer, the second gate insulating layer, and the interlayer insulating layer are further positioned under the dam. Thus, detailed description of the same elements is omitted.

FIG. 19 is a schematic cross-sectional view showing a display device according to an embodiment.

Referring to FIG. 19, the display device according to an embodiment includes a substrate 110, a transistor TFT positioned on a display area DA of the substrate 110, a first electrode 191 electrically connected to the transistor TFT, an emission layer 370 positioned on the first electrode 191, and a second electrode 270 positioned on the emission layer 370.

A buffer layer 111 and a first gate insulating layer 141 may be positioned on the display area DA of the substrate 110, and extend to a peripheral area LA. A second gate insulating layer 142, an interlayer insulating layer 160, a passivation layer 180, and a bank layer 350 may be positioned on the display area DA and positioned on a boundary of the display area DA and the peripheral area LA. A side of the second gate insulating layer 142 and the interlayer insulating layer 160 in the peripheral area LA may not be covered by the passivation layer 180.

A dam 800 may be positioned on the peripheral area LA of the substrate 110. An auxiliary pattern part 710 may be positioned around the dam 800. The dam 800 and the auxiliary pattern part 710 may be positioned on the first gate insulating layer 141.

The second gate insulating layer 142 and the interlayer insulating layer 160 may be positioned under the dam 800. The second gate insulating layer 142 and the interlayer insulating layer 160 may not be positioned under the auxiliary pattern part 710.

The auxiliary pattern part 710 may be positioned around the dam 800 and spaced apart from the dam 800. The auxiliary pattern part 710 may include an electrode auxiliary pattern layer 197 and a photosensitive auxiliary pattern layer 530.

The emission layer 370 and the second electrode 270 may be positioned entirely on the substrate 110. At least some areas of the emission layer 370 and the second electrode 270 may be separated from remaining areas thereof. A portion of the emission layer 370 and the second electrode 270 positioned on the first electrode 191 may be separated from a portion of the emission layer 370 and the second electrode 270 positioned on the auxiliary pattern part 710.

The display device according to an embodiment is described with reference to FIG. 20.

Figure 20:
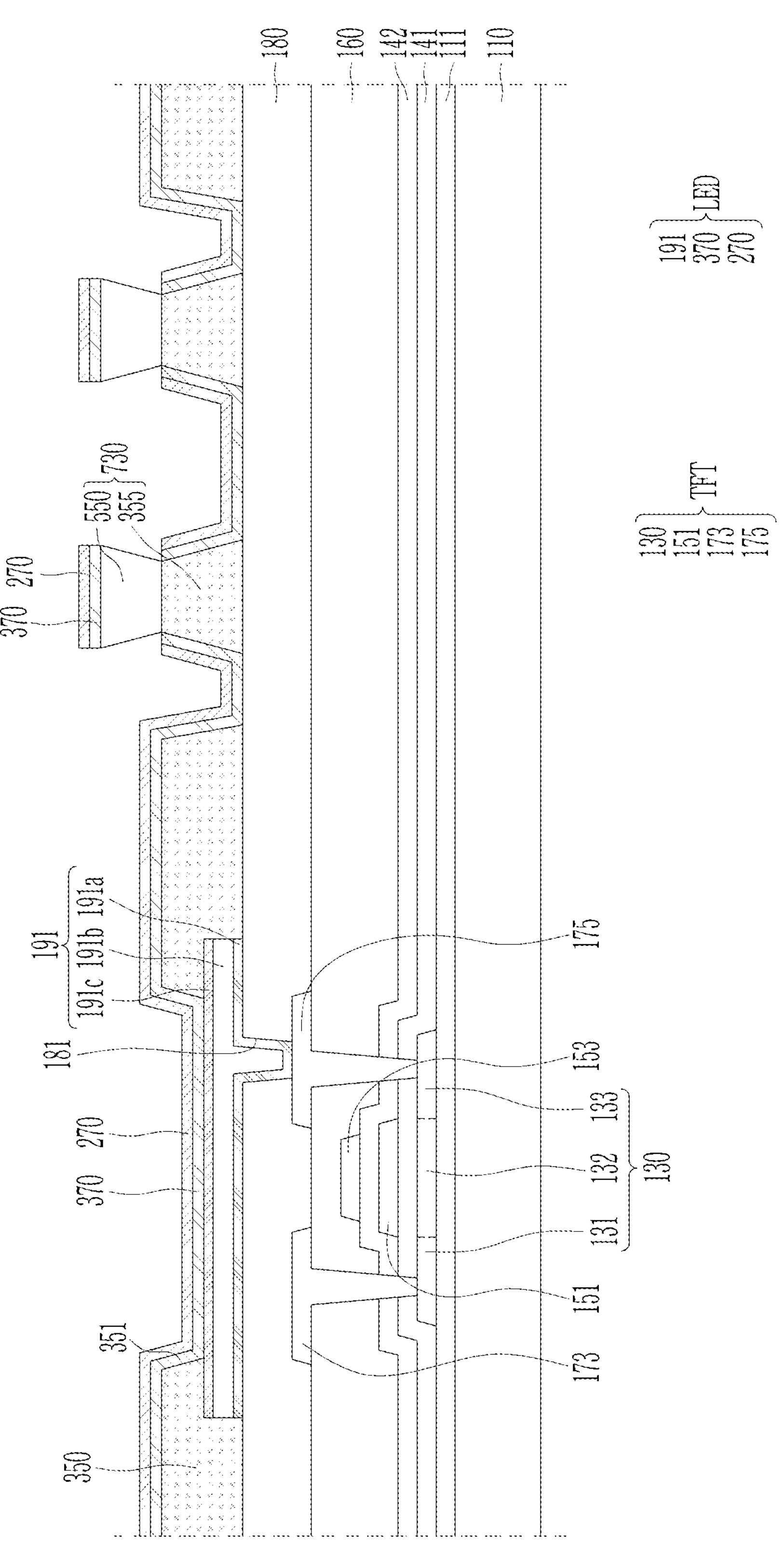
FIG. 20 is a schematic cross-sectional view showing a display device according to an embodiment.

The display device according to an embodiment shown in FIG. 20 is different from the display device according to the embodiment shown in FIGS. 1 to 3 at least in that the pattern part includes an inorganic pattern layer. Thus, detailed description of the same elements is omitted.

FIG. 20 is a schematic cross-sectional view showing a display device according to an embodiment.

Referring to FIG. 20, the display device according to an embodiment includes a substrate 110, a transistor TFT positioned on the substrate 110, a first electrode 191 electrically connected to the transistor TFT, an emission layer 370 disposed on the first electrode 191, a second electrode 270 positioned on the emission layer 370, and a pattern part 730 separated from the first electrode 191. The pattern part 730 may include an inorganic pattern layer 355 and a photosensitive pattern layer 550.

A bank layer 350 may be positioned on the first electrode 191 and a passivation layer 180. In the embodiment, the bank layer 350 may be made of an inorganic insulating material. However, it is not limited thereto, and the bank layer 350 may be made of an organic insulating material. The bank layer 350 may be spaced apart from the pattern part 730. For example, the pattern part 730 may be separated from the bank layer 350.

The inorganic pattern layer 355 of the pattern part 730 and the bank layer 350 may be made of a same material and may be positioned on a same layer. The inorganic pattern layer 355 may be made of an inorganic insulating material. The inorganic pattern layer 355 may be spaced apart from the bank layer 350. The inorganic pattern layer 355 may be positioned (e.g., directly positioned) above the passivation layer 180. However, the disclosure is not limited thereto, and as in the previous embodiment, the pattern part 730 may further include an electrode pattern layer. The inorganic pattern layer 355 may be positioned on the electrode pattern layer.

The photosensitive pattern layer 550 of the pattern part 730 may be made of a photosensitive resin, and may be positioned on the inorganic pattern layer 355. The photosensitive pattern layer 550 and a photoresist used in the process of patterning the bank layer 350 may be made of a same material. The photosensitive pattern layer 550 may be positioned (e.g., directly positioned) above the inorganic pattern layer 355. A side of the photosensitive pattern layer 550 may have a reversed taper shape in a cross-sectional view.

The emission layer 370 and the second electrode 270 may be positioned entirely on the substrate 110. At least some areas of the emission layer 370 and the second electrode 270 may be separated from remaining areas thereof. A portion of the emission layer 370 positioned on the first electrode 191 may be separated from a portion of the emission layer 370 positioned on the pattern part 730. In the display device according to an embodiment, the portion of the emission layer 370 positioned on the first electrode 191 may be separated from the portion of the emission layer 370 positioned on the pattern part 730. Thus, a transmission path of a lateral leakage may be reduced, and a color change (e.g., optical characteristics of color change) may be improved in a low grayscale. A portion of the second electrode 270 positioned on the first electrode 191 may be separated from a portion of the second electrode 270 positioned on the pattern part 730. The emission layer 370 and the second electrode 270 may be separated from an edge of the pattern part 730. A portion of the emission layer 370 and the second electrode 270 positioned on the pattern part 730 may be separated from a portion of the emission layer 370 and the second electrode 270 positioned outside the pattern part 730. Some of the layers constituting the emission layer 370 may not be separated, but may be connected as a whole. Likewise, the second electrode 270 may be connected as a whole. For example, the second electrode 270 may have a connected shape on the edge of the pattern part 730.

Although not shown, an encapsulation layer may be further positioned on the second electrode 270.

The method of manufacturing the display device according to an embodiment is described as follows with reference to FIGS. 21 to 26.

FIGS. 21 to 26 are schematic cross-sectional views showing a manufacturing process of a display device according to an embodiment in order.

Figure 21:
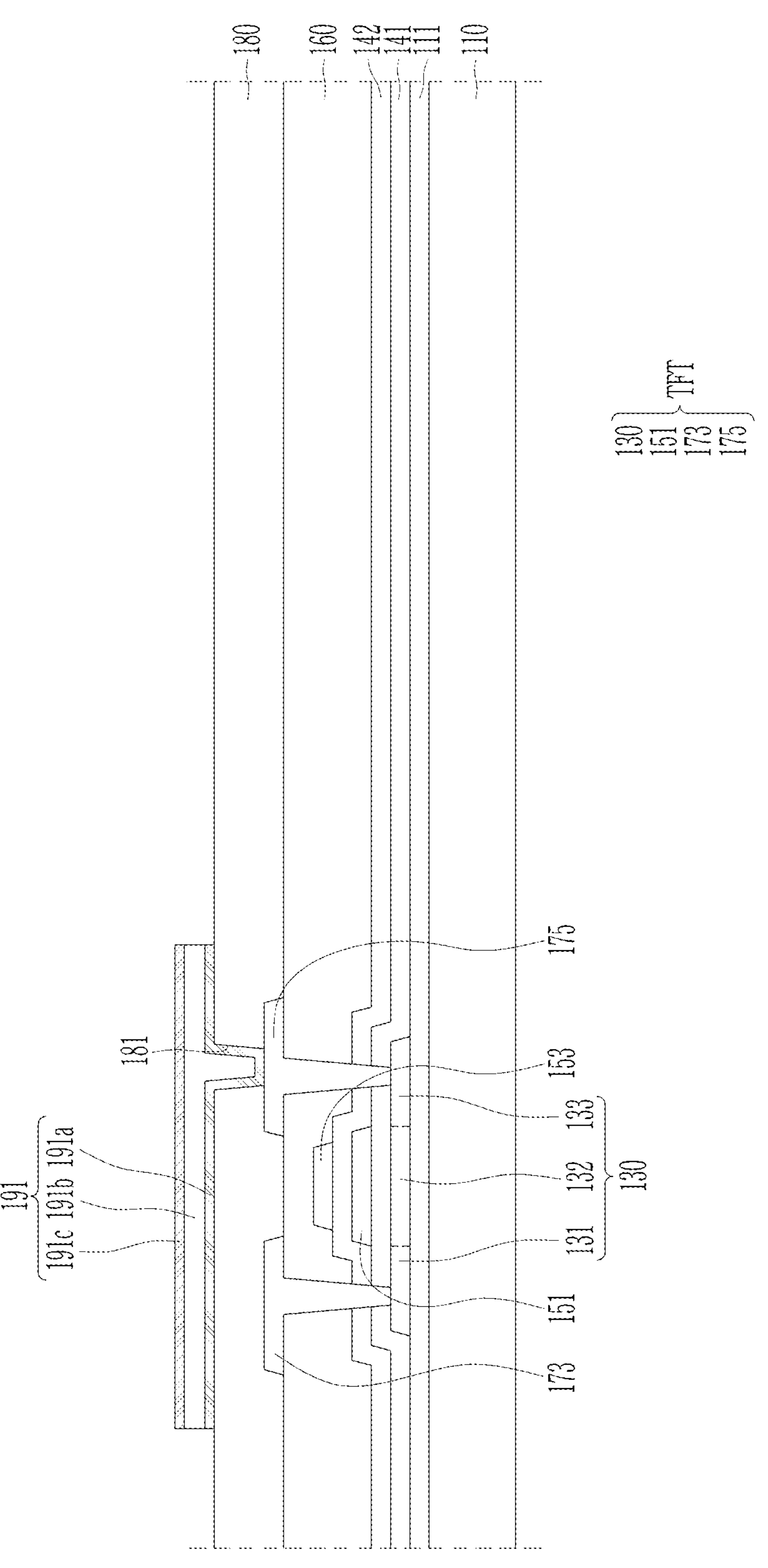
FIGS. 21 to 26 are schematic cross-sectional views showing a method of manufacturing a display device according to an embodiment.

Referring to FIG. 21, a thin film transistor TFT including a semiconductor 130, a gate electrode 151, a source electrode 173, and a drain electrode 175 may be formed on a substrate 110. A passivation layer 180 may be formed on a thin film transistor TFT by using an organic insulating material. An opening 181 is formed by patterning the passivation layer 180, and a first electrode 191 is formed on the passivation layer 180. The first electrode 191 may be electrically connected to the drain electrode 175 through the opening 181.

Figure 22:
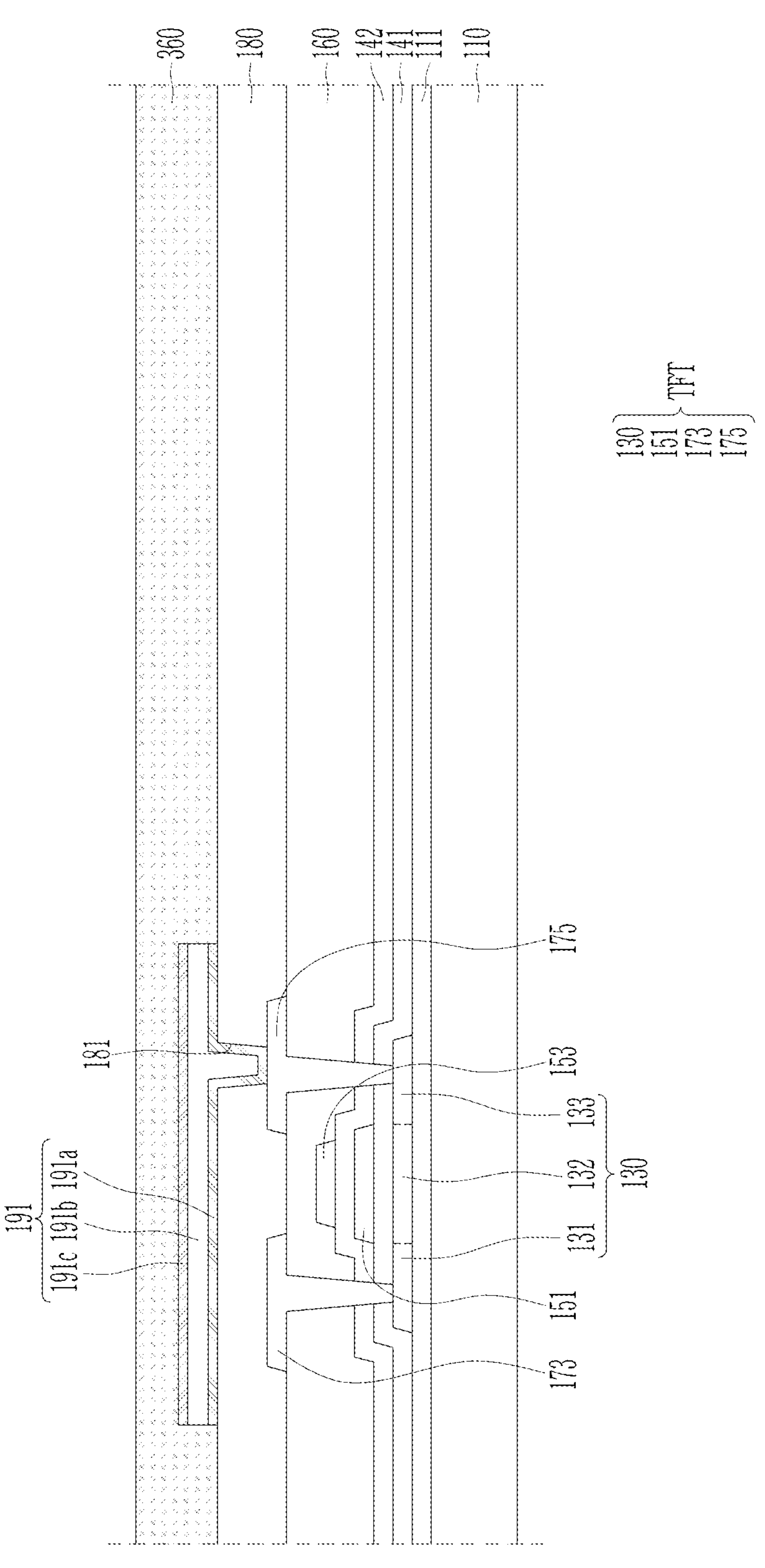

Referring to FIG. 22, an inorganic insulating layer (or inorganic insulating material layer) 360 may be formed on the first electrode 191 by using an inorganic insulating material. The inorganic insulating layer 360 may be positioned on the passivation layer 180.

Figure 23:
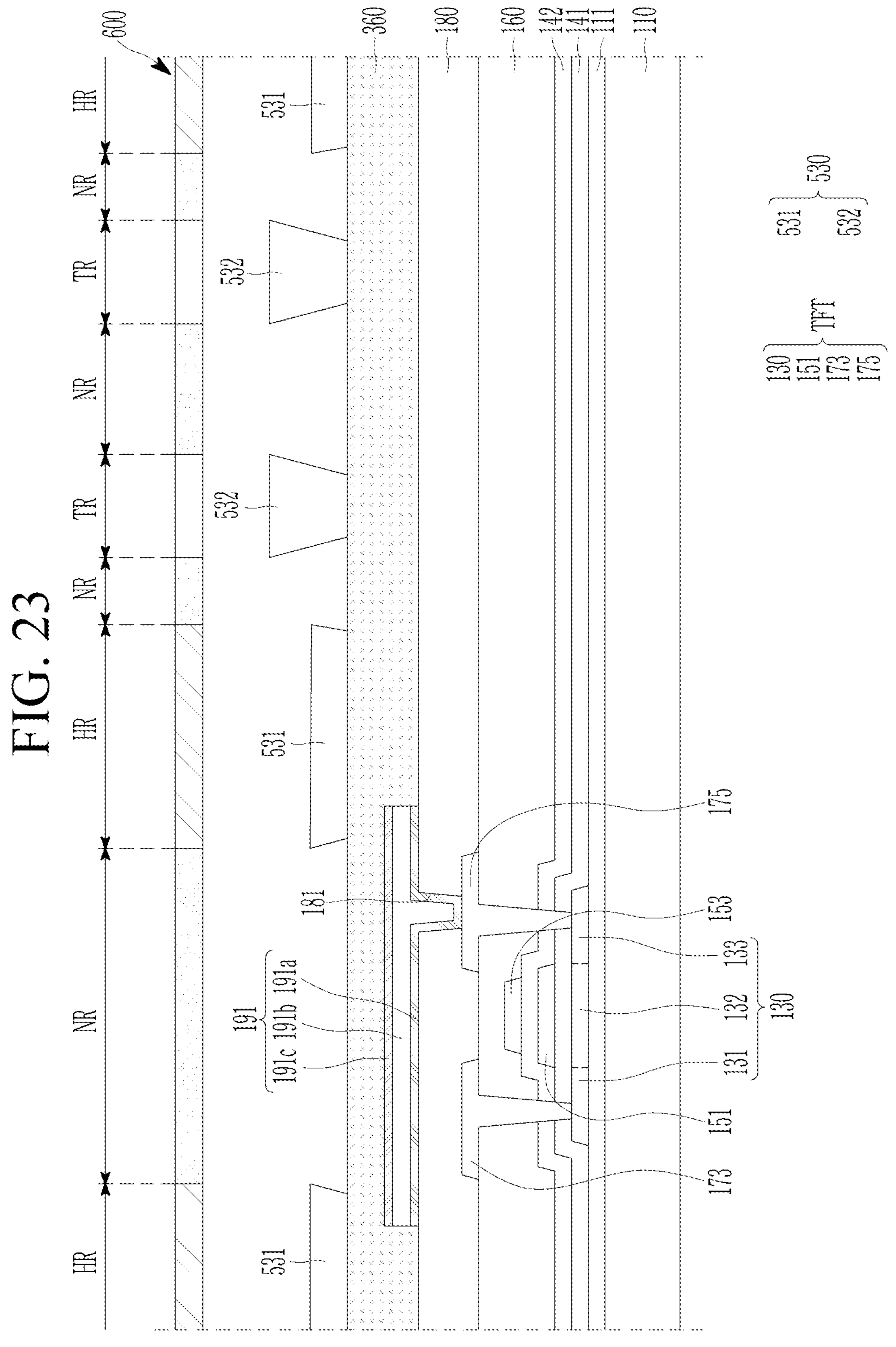

Referring to FIG. 23, a photosensitive resin may be coated on the inorganic insulating layer 360. A mask 600 may be aligned on the substrate 110. A photo process may be performed on the coated photosensitive resin using the mask 600. Thus, a photoresist pattern 530 may be formed.

The mask 600 may include a transmissive portion TR, a semi-transmissive portion HR, and a non-transmissive portion NR. The photoresist pattern 530 may be formed of a negative photoresist. The photoresist pattern 530 may include a first portion 531 having a first thickness and a second portion 532 having a second thickness. The second thickness may be thicker than the first thickness. The first portion 531 of the photoresist pattern 530 may be a portion corresponding to the semi-transmissive portion HR of the mask 600. The second portion 532 of the photoresist pattern 530 may be a portion corresponding to the transmissive portion TR of the mask 600. A side of the photoresist pattern 530 may be patterned to have a reversed taper shape.

Figure 24:
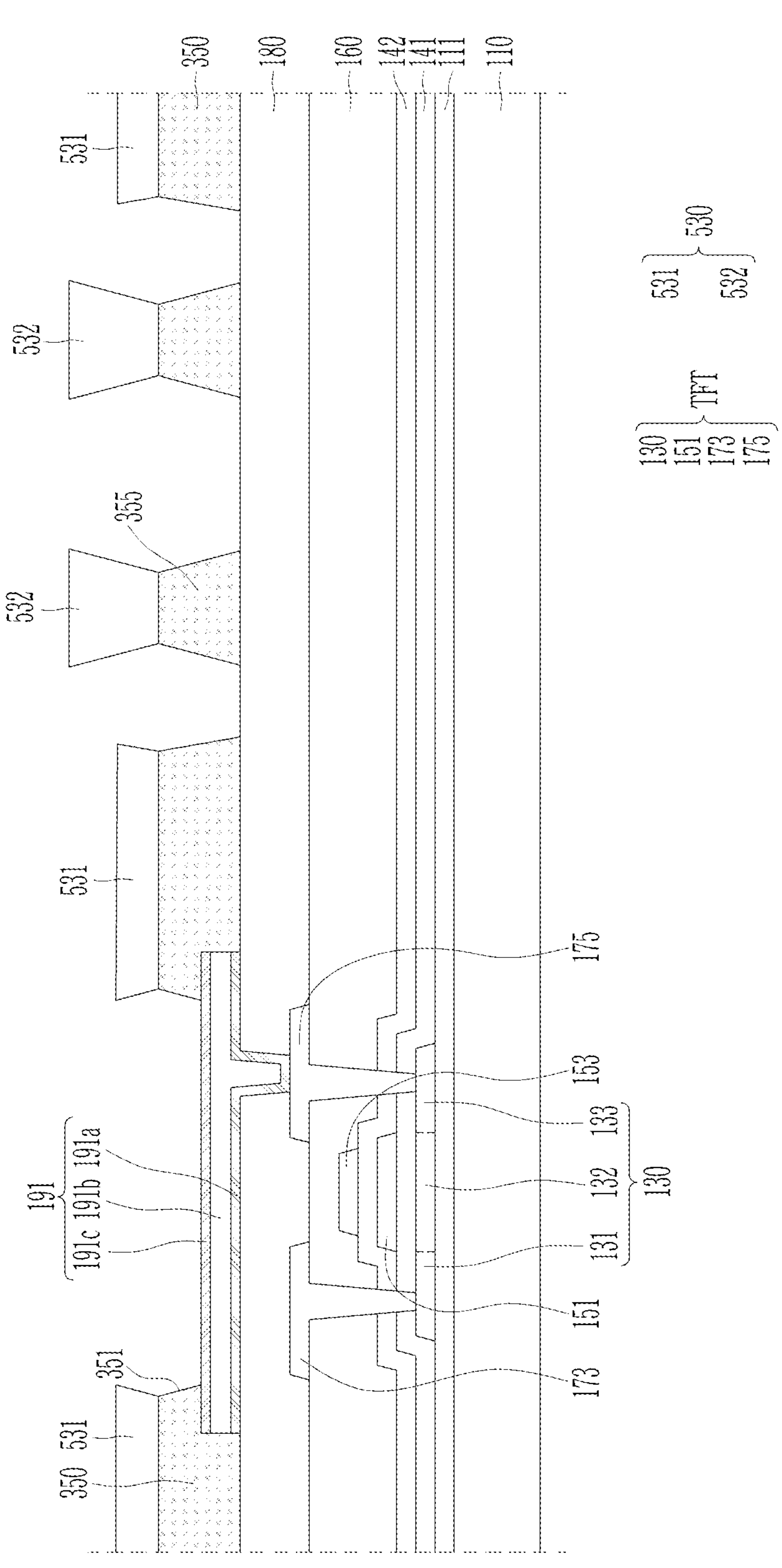

Referring to FIG. 24, the inorganic insulating layer 360 may be etched by using the photoresist pattern 530 as a mask (e.g., etch mask). By patterning the inorganic insulating layer 360, the bank layer 350 and the inorganic pattern layer 355 may be formed. A portion of the inorganic insulating layer 360 positioned under the first portion 531 of the photoresist pattern 530 may be the bank layer 350. The bank layer 350 may be positioned over an edge of the first electrode 191. The bank layer 350 may include a pixel opening 351, and the pixel opening 351 may overlap a central portion of the first electrode 191 in a plan view. A portion of the inorganic insulating layer 360 positioned under the second portion 532 of the photoresist pattern 530 may be the inorganic pattern layer 355. The inorganic pattern layer 355 may be spaced apart from the bank layer 350. The inorganic pattern layer 355 and the bank layer 350 may be formed in a same process.

Figure 25:
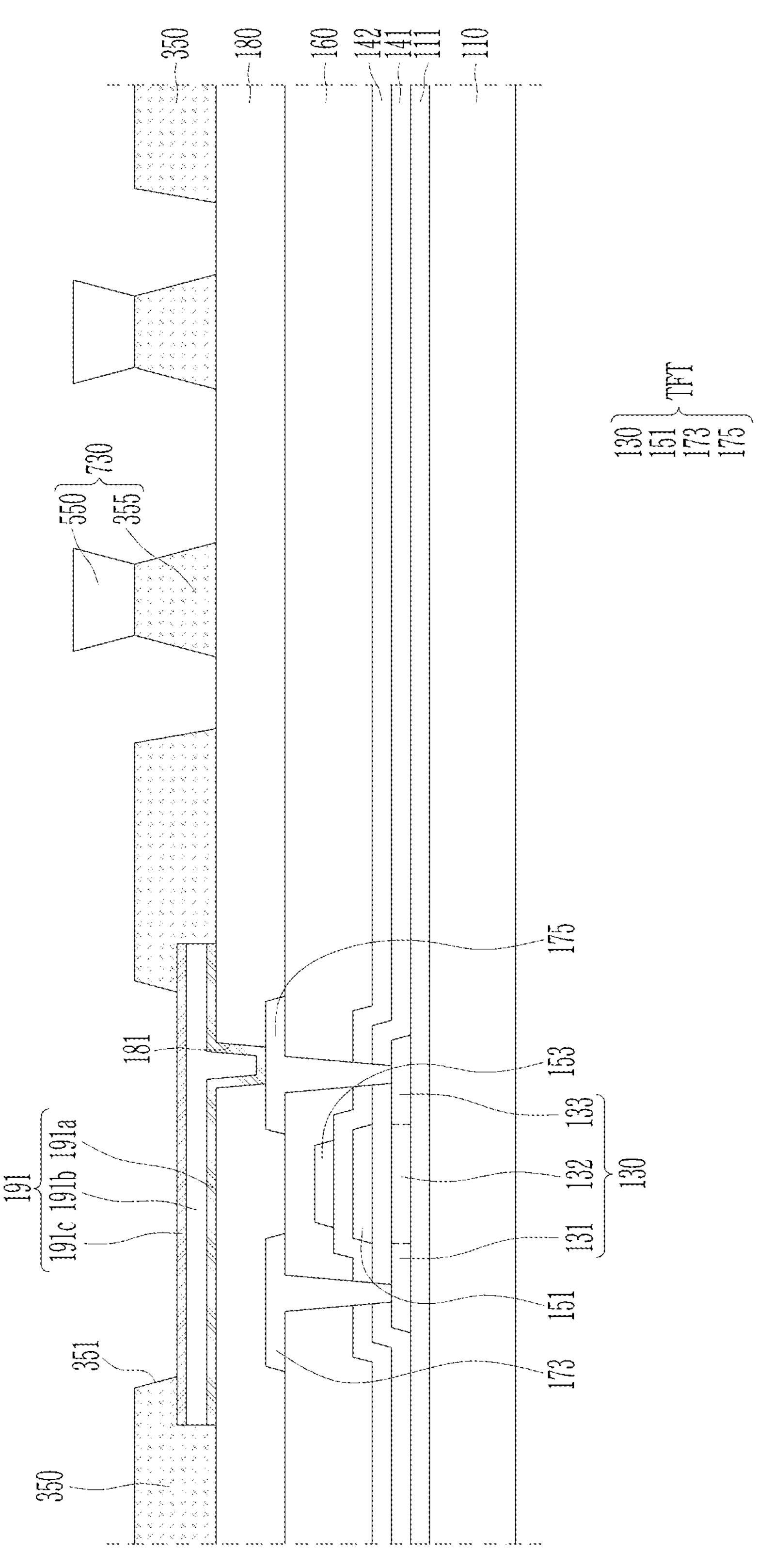

Referring to FIG. 25, by ashing the photoresist pattern 530, the first portion 531 of the photoresist pattern 530 positioned on the bank layer 350 may be removed and a photosensitive pattern layer 550 may be formed on the inorganic pattern layer 355. A thickness of the second portion 532 of the photoresist pattern 530 positioned on the inorganic pattern layer 355 may be reduced to form the photosensitive pattern layer 550. A side surface of the photosensitive pattern layer 550 may have a reversed taper shape. The photosensitive pattern layer 550 and the inorganic pattern layer 355 may form the pattern part 730. The pattern part 730 may be spaced apart from the bank layer 350. Also, the pattern part 730 may be spaced apart from the first electrode 191.

Figure 26:
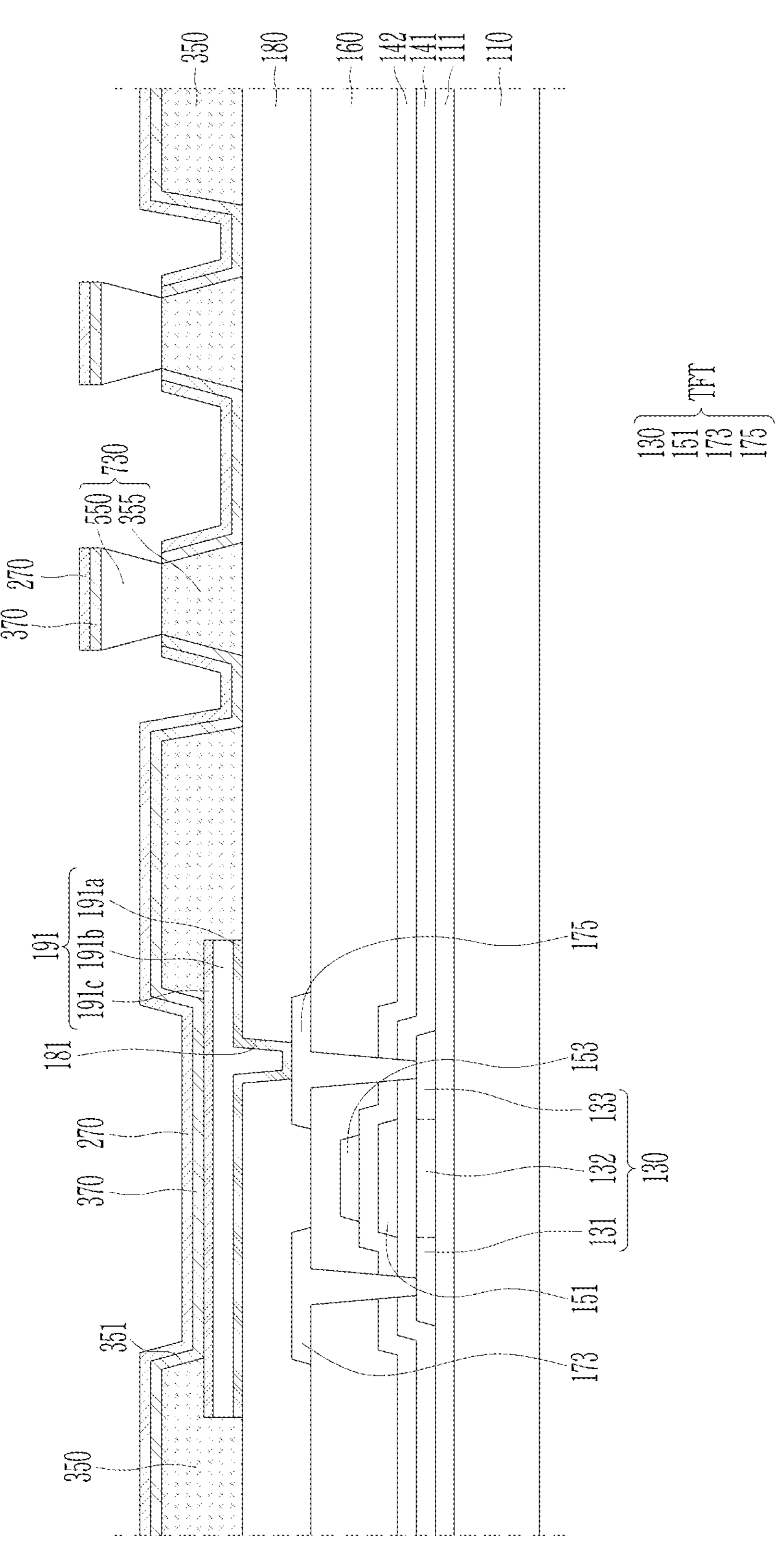

Referring to FIG. 26, an emission layer 370 may be formed on the first electrode 191. The emission layer 370 may be positioned entirely over the substrate 110. Accordingly, the emission layer 370 may also be positioned on the bank layer 350 and the pattern part 730. The emission layer 370 may be positioned between pattern parts 730.

The mission layer 370 may be formed by sequentially depositing layers. The emission layer 370 may include light emission parts and a charge generation layer positioned therebetween.

A second electrode 270 may be formed on the emission layer 370 by using a conductive material. The second electrode 270 may be formed of a transparent conductive oxide film, a translucent conductive material, or the like. The second electrode 270 may be positioned (e.g., directly positioned) on the emission layer 370 and may be entirely formed on the substrate 110.

The emission layer 370 and the second electrode 270 may be positioned entirely on the substrate 110. At least some areas of the emission layer 370 and the second electrode 270 may have a shape separated from remaining areas thereof. A portion of the emission layer 370 positioned on the first electrode 191 may be separated from a portion of the emission layer 370 positioned on the pattern part 730. In the display device according to an embodiment, the portion of the emission layer 370 positioned on the first electrode 191 may be separated from the portion of the emission layer 370 positioned on the pattern part 730. Thus, a transmission path of a lateral leakage may be reduced, and a color change (e.g., optical characteristics of color change) may be improved in low grayscale. A portion of the second electrode 270 positioned on the first electrode 191 may be separated from a portion of the second electrode 270 positioned on the pattern part 730. The emission layer 370 and the second electrode 270 may be separated from an edge of the pattern part 730. The portion of the emission layer 370 and the second electrode 270 positioned on the pattern part 730 may be separated from the portion of the emission layer 370 and the second electrode 270 positioned outside the pattern part 730. Some of the layers constituting the emission layer 370 may not be separated, but may be connected as a whole. Likewise, the second electrode 270 may be connected as a whole. For example, the second electrode 270 may have a connected shape on the edge of the pattern part 730.

The display device according to an embodiment is described with reference to FIG. 27 below.

Figure 27:
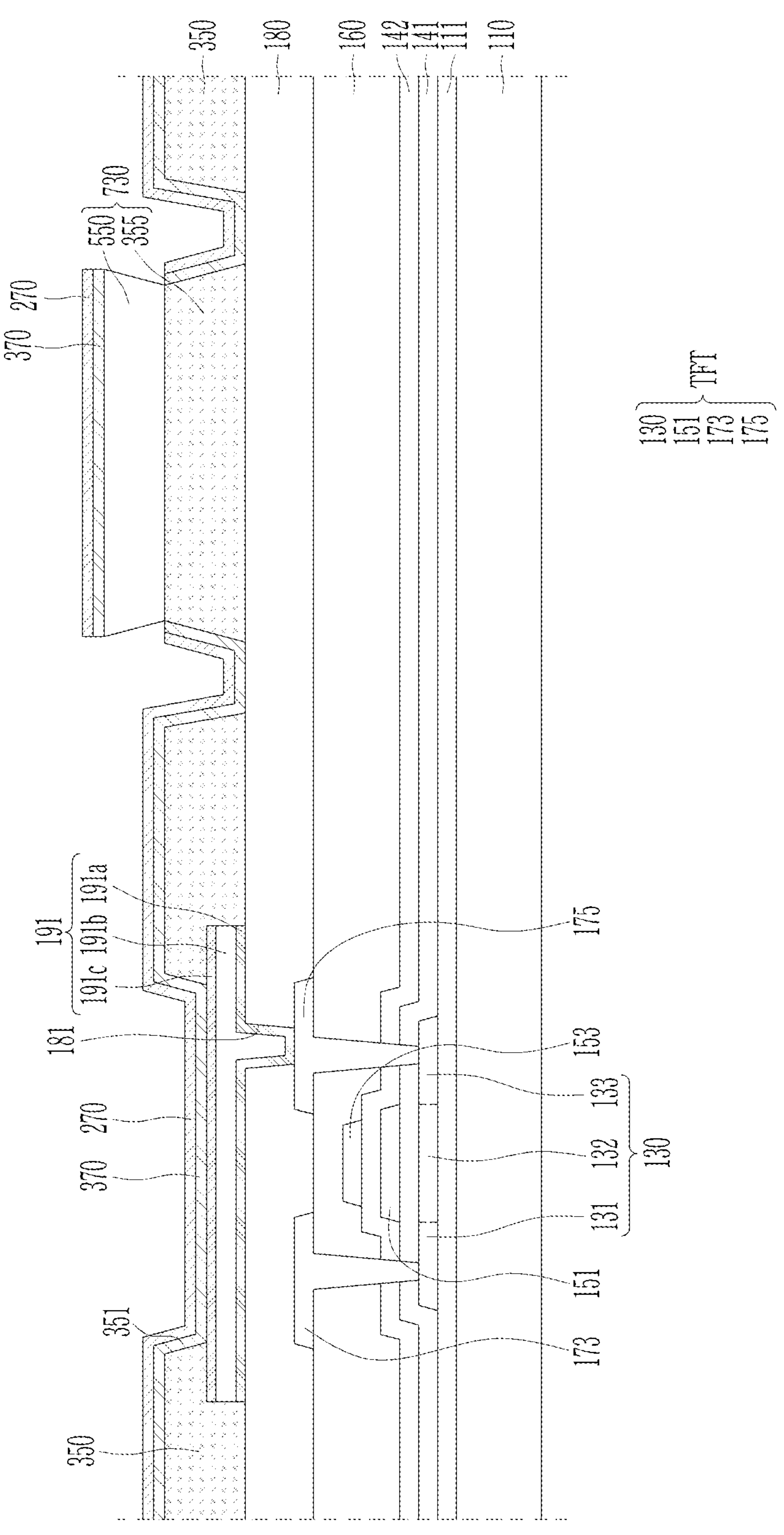
FIG. 27 is a schematic cross-sectional view showing a display device according to an embodiment.

The display device according to an embodiment shown in FIG. 27 is different from the display device according to the embodiment shown in FIG. 20 at least in that the number of pattern parts is reduced. Thus, detailed description of the same elements is omitted.

FIG. 27 is a schematic cross-sectional view showing a display device according to an embodiment.

Referring to FIG. 27, the display device according to an embodiment includes a substrate 110, a transistor TFT positioned on the substrate 110, a first electrode 191 electrically connected to the transistor TFT, an emission layer 370 disposed on the first electrode 191, a second electrode 270 positioned on the emission layer 370, and a pattern part 730 separated from the first electrode 191. The pattern part 730 may include an inorganic pattern layer 355 and a photosensitive pattern layer 550.

A bank layer 350 may be positioned on the first electrode 191 and the passivation layer 180. The bank layer 350 may be made of an inorganic insulating material. The bank layer 350 may be spaced apart from the pattern part 730. For example, the pattern part 730 may be separated from the bank layer 350.

The inorganic pattern layer 355 of the pattern part 730 and the bank layer 350 may be made of a same material and positioned on a same layer. The inorganic pattern layer 355 may be spaced apart from the bank layer 350. The photosensitive pattern layer 550 of the pattern part 730 may be made of a photosensitive resin, and may be positioned on the inorganic pattern layer 355.

In the previous embodiment, two pattern parts 730 may be positioned between adjacent ones of the bank layers 350 and spaced apart from the bank layer 350. Two pattern parts 730 may be positioned between the adjacent bank layers 350, and spaced apart from the bank layer 350. For example, in the embodiment, the single pattern part 730 may be positioned between adjacent pixels. A width of the pattern part 730 in the embodiment may be wider than a width of the pattern part 730 in the preceding embodiment. For example, the width of pattern part 730 in the embodiment may be made wider than the width of two pattern parts 730 in the preceding embodiment. However, this is only an example, and the number of the pattern parts 730 positioned between the adjacent pixels and the width of each pattern part 730 may be variously changed. The width of the pattern part 730 may be constant or different from each other.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a transistor positioned on a substrate;

a first electrode electrically connected to the transistor;

an emission layer positioned on the first electrode;

a second electrode positioned on the emission layer; and a pattern part spaced apart from the first electrode, wherein the pattern part includes an electrode pattern layer that is made of a same material and positioned on a same layer as the first electrode, and a photosensitive pattern layer made of a photosensitive resin, wherein the photosensitive pattern layer is positioned directly on the electrode pattern layer, and wherein a side surface of the electrode pattern layer is vertically aligned with a side surface of the photosensitive pattern layer, wherein the electrode pattern layer is electrically isolated from the first electrode and the second electrode.

2. The display device of claim 1, wherein the photosensitive pattern layer has a different material from a material of a bank layer defining a pixel opening on the first electrode.

3. The display device of claim 1, further comprising:

a bank layer positioned on an edge of the first electrode, wherein the pattern part further includes an inorganic pattern layer, and the inorganic pattern layer and the bank layer are made of a same material and positioned on a same layer.

4. The display device of claim 3, wherein the photosensitive pattern layer is positioned directly on the inorganic pattern layer.

5. The display device of claim 4, wherein the pattern part is separated from the bank layer.

6. The display device of claim 1, wherein a side of the photosensitive pattern layer has a reversed taper shape.

7. The display device of claim 1, wherein the substrate includes a plurality of pixels, and the pattern part is positioned between the plurality of pixels.

8. The display device of claim 7, wherein each of the plurality of pixels is a polygon including a side extending in a first direction and a side extending in a second direction perpendicular to the first direction in a plan view, and the pattern part is formed with a bar shape extending in the first direction or the second direction in a plan view.

9. The display device of claim 8, wherein at least one pattern part is positioned between adjacent ones of the plurality of pixels.

10. The display device of claim 1, wherein the emission layer includes:

a plurality of light emission parts; and a charge generation layer positioned between the plurality of light emission parts.

11. The display device of claim 10, wherein the emission layer and the second electrode are positioned entirely on the substrate, and a portion of the emission layer and the second electrode positioned over the first electrode is separated from a portion of the emission layer and the second electrode positioned over the pattern part.

12. The display device of claim 1, wherein the display device has:

a display area;

an opening area positioned within the display area; and a peripheral area positioned between the opening area and the display area, the display device further includes:

a dam positioned in the peripheral area; and an auxiliary pattern part positioned around the dam and spaced apart from the dam, and the auxiliary pattern part includes a photosensitive auxiliary pattern layer made of a photosensitive resin.

13. The display device of claim 12, wherein the photosensitive auxiliary pattern layer and the photosensitive pattern layer are made of a same material and positioned on a same layer.

* * * * *